US012666738B2

(12) United States Patent
Huang et al.

(10) Patent No.: US 12,666,738 B2
(45) Date of Patent: Jun. 23, 2026

(54) SHIFTED MICRO-LENSES FOR INCREASED IMAGING DEVICE PERFORMANCE

(71) Applicant: Taiwan Semiconductor Manufacturing Company, Ltd., Hsinchu (TW)

(72) Inventors: Cheng Yu Huang, Hsinchu (TW); Wen-Hau Wu, New Taipei City (TW); Chun-Hao Chuang, Hsinchu City (TW); Keng-Yu Chou, Kaohsiung City (TW); Wei-Chieh Chiang, Yuanlin Township (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 505 days.

(21) Appl. No.: 18/150,893

(22) Filed: Jan. 6, 2023

(65) Prior Publication Data
US 2024/0113143 A1 Apr. 4, 2024

Related U.S. Application Data

(60) Provisional application No. 63/411,215, filed on Sep. 29, 2022.

(51) Int. Cl.
*H10F 39/00* (2025.01)
*H10F 39/18* (2025.01)
(52) U.S. Cl.
CPC ....... *H10F 39/8063* (2025.01); *H10F 39/024* (2025.01); *H10F 39/182* (2025.01); *H10F 39/8053* (2025.01); *H10F 39/807* (2025.01)

(58) Field of Classification Search
CPC .... H10F 39/8037; H10F 39/199; H10F 30/21; H10F 30/221; H10F 30/2218; H10F 30/26; H10F 39/802; H10F 39/8057; H10F 39/8067; H10F 77/40; H10F 39/182–1825; H10F 39/184–1847; H10F 39/186–1865; H10F 39/189–1898; H10F 30/288;
(Continued)

(56) References Cited

U.S. PATENT DOCUMENTS

2015/0350529 A1 12/2015 Kato et al.
2016/0307941 A1* 10/2016 Cheng ................... H10F 39/024
(Continued)

FOREIGN PATENT DOCUMENTS

CN 110278377 A 9/2019
KR 20040006813 A 1/2004

*Primary Examiner* — Moin M Rahman
(74) *Attorney, Agent, or Firm* — Eschweiler & Potashnik, LLC

(57) ABSTRACT
Various embodiments of the present disclosure are directed towards an imaging device including a first image sensor element and a second image sensor element respectively comprising a pixel unit disposed within a semiconductor substrate. The first image sensor element is adjacent to the second image sensor element. A first micro-lens overlies the first image sensor element and is laterally shifted from a center of the pixel unit of the first image sensor element by a first lens shift amount. A second micro-lens overlies the second image sensor element and is laterally shifted from a center of the pixel unit of the second image sensor element by a second lens shift amount different from the first lens shift amount.

20 Claims, 25 Drawing Sheets

(58) Field of Classification Search
 CPC ......... H10F 30/289; H10F 77/12–1285; H10F
 71/00–1395; H10F 77/933; H10F
 77/957–959; H10F 77/50; H10F 77/496;
 H10F 77/413; H10F 77/407; H10F
 77/703; H10F 77/707; H10F 39/8063;
 H10F 39/024; H10F 39/8053; H10F
 39/807; H10F 39/8023; H10F 39/805;
 H10F 39/812; G01S 7/4863; G01S 17/10;
 G01S 17/894; H10K 30/88; H10K 30/87;
 H10K 50/844; H10K 59/873; H10K
 77/111; H10K 59/131; H10K 59/129;
 H10K 2102/311; H10K 2102/361; G02F
 1/133305; G02F 1/133388; G02F
 1/13452; G02F 1/136254; G02F 2201/50;
 G02F 2202/28; H01L 2224/73204; Y02E
 10/549; G09G 2300/0426
 See application file for complete search history.

(56) References Cited

U.S. PATENT DOCUMENTS

| | | | |
|---|---|---|---|
| 2016/0351610 A1* | 12/2016 | Chen | H10F 39/8057 |
| 2017/0366770 A1 | 12/2017 | Yokogawa et al. | |
| 2018/0047766 A1 | 2/2018 | Pyo et al. | |
| 2018/0301484 A1 | 10/2018 | Vaartstra et al. | |
| 2019/0148433 A1 | 5/2019 | Kuo et al. | |
| 2019/0326341 A1 | 10/2019 | Gravelle, Jr. | |
| 2022/0109020 A1* | 4/2022 | Lee | H10F 39/8063 |
| 2022/0293659 A1 | 9/2022 | Cho | |
| 2022/0302182 A1 | 9/2022 | Kuo et al. | |
| 2024/0072086 A1* | 2/2024 | Lee | H10F 39/811 |

* cited by examiner

1400
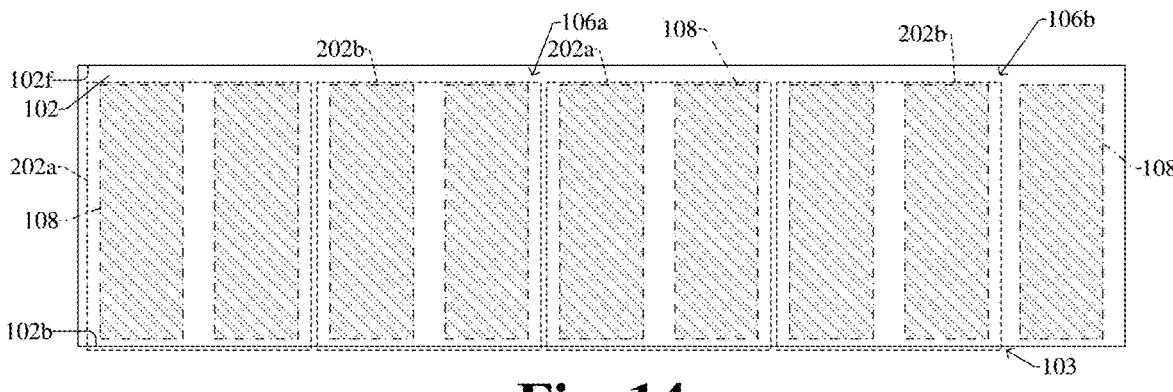
Fig. 14
1500
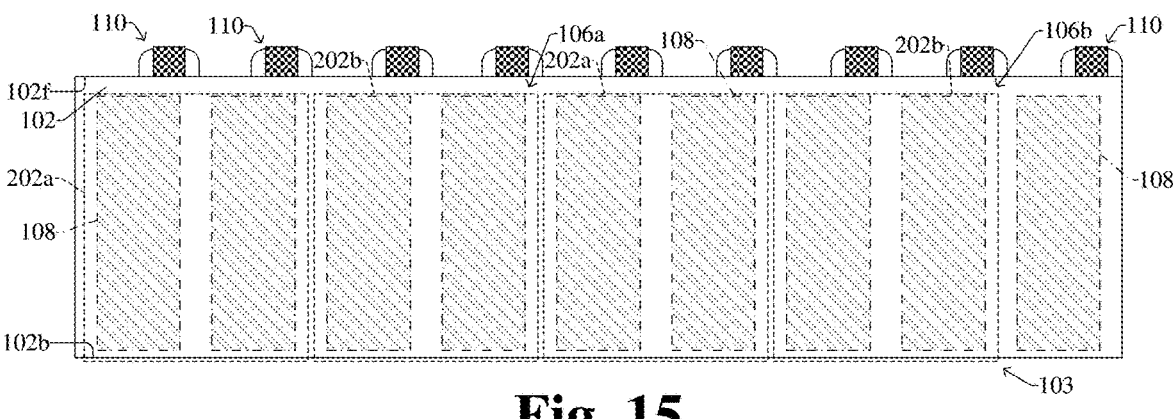
Fig. 15
1600
Fig. 16

1700

1800

2200

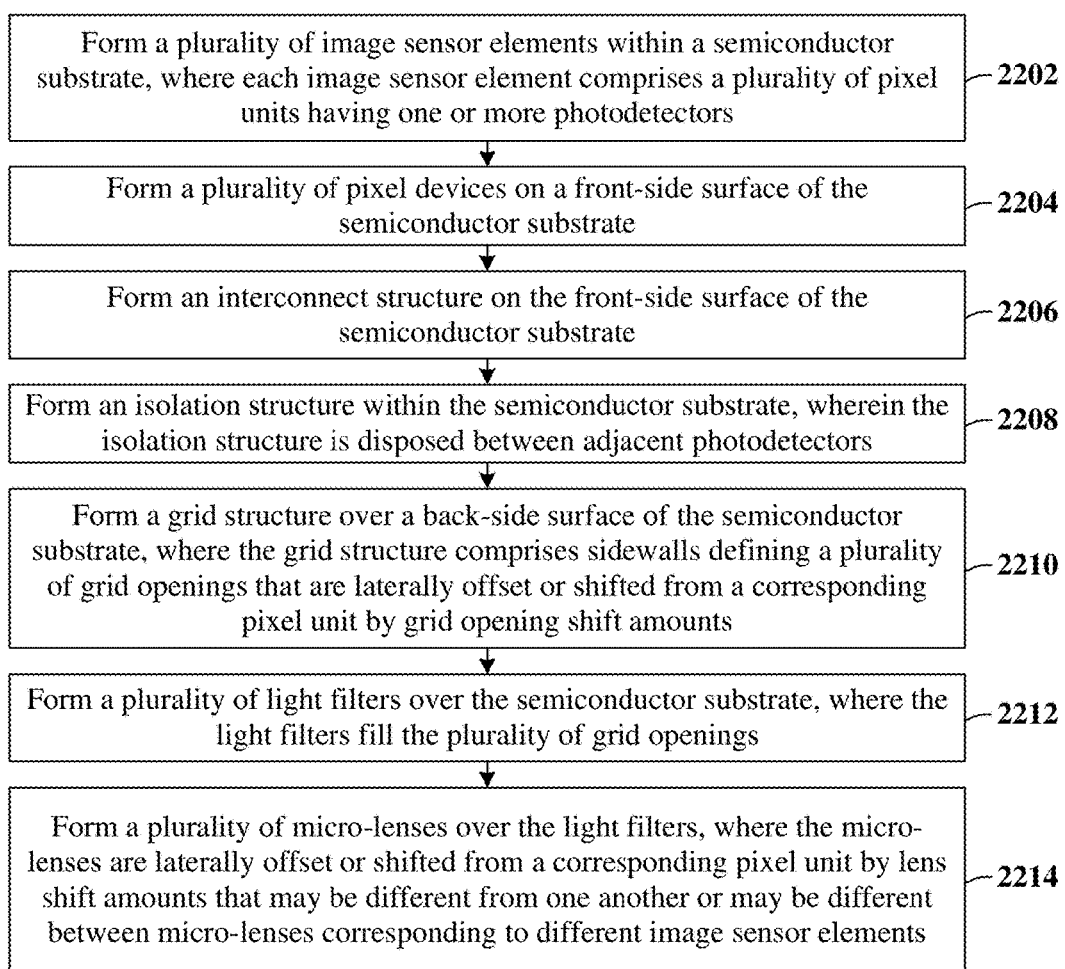

| Form a plurality of image sensor elements within a semiconductor substrate, where each image sensor element comprises a plurality of pixel units having one or more photodetectors | 2202 |

| Form a plurality of pixel devices on a front-side surface of the semiconductor substrate | 2204 |

| Form an interconnect structure on the front-side surface of the semiconductor substrate | 2206 |

| Form an isolation structure within the semiconductor substrate, wherein the isolation structure is disposed between adjacent photodetectors | 2208 |

| Form a grid structure over a back-side surface of the semiconductor substrate, where the grid structure comprises sidewalls defining a plurality of grid openings that are laterally offset or shifted from a corresponding pixel unit by grid opening shift amounts | 2210 |

| Form a plurality of light filters over the semiconductor substrate, where the light filters fill the plurality of grid openings | 2212 |

| Form a plurality of micro-lenses over the light filters, where the micro-lenses are laterally offset or shifted from a corresponding pixel unit by lens shift amounts that may be different from one another or may be different between micro-lenses corresponding to different image sensor elements | 2214 |

Fig. 22

SHIFTED MICRO-LENSES FOR INCREASED IMAGING DEVICE PERFORMANCE

REFERENCE TO RELATED APPLICATION

This Application claims the benefit of U.S. Provisional Application No. 63/411,215, filed on Sep. 29, 2022, the contents of which are hereby incorporated by reference in their entirety.

BACKGROUND

Integrated circuits (IC) with image sensors are used in a wide range of modern day electronic devices. In recent years, complementary metal-oxide semiconductor (CMOS) image sensors (CISs) have begun to see widespread use, largely replacing charge-coupled devices (CCD) image sensors. Compared to CCD image sensors, CISs are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14 through 21A-21B illustrate various views of some embodiments of a method of forming an imaging device including an image sensor having a plurality of image sensor elements and a plurality of micro-lenses having different lens shift amounts.

FIG. 22 illustrates a methodology in flowchart format of some embodiments of a method of forming an imaging device including an image sensor having a plurality of image sensor elements and a plurality of micro-lenses having different lens shift amounts.

DETAILED DESCRIPTION

Figure 1A:
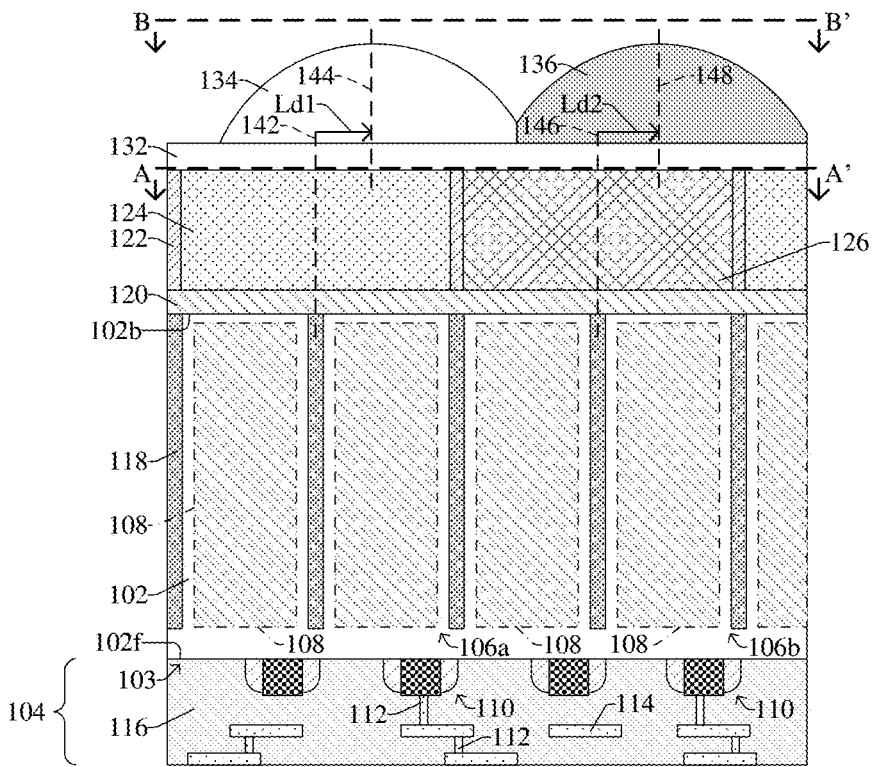
FIGS. 1A-1D illustrate various views of some embodiments of an imaging device including an image sensor having a plurality of image sensor elements and a plurality of micro-lenses having different lens shift amounts.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

Some complementary metal-oxide semiconductor sensors (CISs) include an imaging device having a plurality of image sensor elements arranged in an array comprising a plurality of rows and columns. Each image sensor element comprises one or more pixel unit(s) each having one or more photodetector(s) disposed within a semiconductor substrate. A light filter array having a plurality of light filters (e.g., a plurality of color filters) is disposed along a back-side surface of the semiconductor substrate and overlies each pixel unit. The light filters are each configured to pass a first range of wavelengths and block a second range of wavelengths different from the first range of wavelengths. Further, a micro-lens array having a plurality of micro-lenses is disposed over the light filter array. Each micro-lens comprises a curved upper surface configured to direct incident light towards a corresponding pixel unit. Typically centers of the micro-lenses are aligned with a center of a corresponding underlying pixel unit. For example, each pixel unit may comprise four photodetectors arranged in a 2×2 layout, where a center of an overlying micro-lenses is aligned with a center of the four photodetectors.

Further, a module lens may overlie the imaging device and is configured to focus light on the plurality of image sensor elements. A chief ray angle (CRA) of the module lens corresponds to the angle of incidence of an off-axis ray passing through the lens stop's center on the image plane. In an effort to adjust for a non-zero CRA, a center of each micro-lens in the plurality of micro-lenses is shifted towards a center of the array of image sensor elements to increase the uniformity of incident light input to each image sensor element. Generally, each micro-lens has a similar or same shift towards the center of the array of image sensor elements based on the CRA, such that the micro-lenses have similar or same pitches, spacing, areas, and/or shapes.

Further, an image sensor element may be configured as a 2×2 image sensor arranged in a Bayer pattern which comprises a red image sensor element, a blue image sensor element, a first green image sensor element, and a second green image sensor element. However, due to differences in refractive indices of different light filters, differences in spot sizes of different wavelengths of light, and differences in a location of each image sensor element from the center of the array of image sensor elements an optimal shift for a micro-lens(es) over the red image sensor element may be different from an optimal shift for a micro-lens(es) over the blue image sensor element. Because each micro-lens has a same or similar shift towards the center of the array of image sensor elements, a performance (e.g., sensitivity, full well capacity, etc.) of photodetectors in a first image sensor element (e.g., the red image sensor element) may be worse than a performance of photodetectors in a second image sensor element (e.g., the blue image sensor element) adjacent to the first image sensor element. This results in non-uniform incident light input to the image sensor elements, thereby degrading a performance of the image sensor elements and decreasing a quality and/or accuracy of an image produced from the imaging device.

In some embodiments, the present application is directed towards an imaging device having a plurality of micro-lenses disposed over a plurality of image sensor elements and configured to increase performance of the image sensor elements. The image sensor elements are arranged in an array comprising a plurality of rows and columns. The image sensor elements are disposed in a semiconductor substrate. Each image sensor element comprises one or more pixel unit(s) each having one or more photodetector(s). A plurality of light filters overlies the imaging device. Each light filter overlies a corresponding pixel unit. Further, a micro-lens array having a plurality of micro-lenses is disposed over the light filter array. Each micro-lens comprises a curved upper surface configured to direct light towards a corresponding underlying pixel unit. Further, the micro-lenses are each laterally offset or shifted from a center of a corresponding pixel unit by a different lens shift amount to optimize performance of the corresponding pixel unit. For example, due to differences in refractive indices, in spot sizes of different wavelengths, and CRAs a first lens shift amount of a first micro-lens from a center of a red image sensor element is different from a second lens shift amount of a second micro-lens from a center of an adjacent green image sensor element. The first lens shift amount of the first micro-lens is configured to optimize performance for the red image sensor element and the second lens shift amount of the second micro-lens is configured to optimize performance of the green image sensor element. As a result of the different lens shift amounts of the micro-lenses, pitches, spacing, areas, and/or shapes of the micro-lenses across the micro-lens array may be different from one another. Because the lens shift amount of each micro-lens is optimized for the corresponding underlying pixel unit, a performance (e.g., sensitivity, full well capacity, etc.) of the image sensor elements, a uniformity of incident light across the imaging device, and an accuracy of images produced from the imaging device are improved.

Figure 1B:
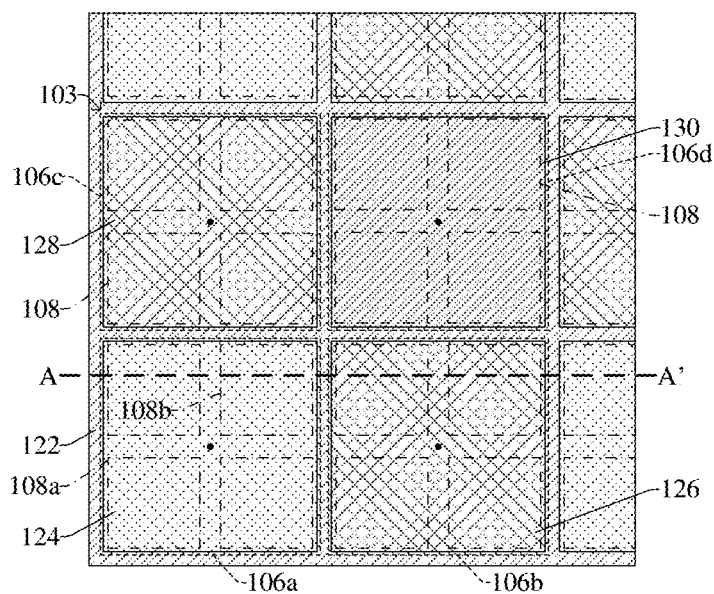
Figure 1C:
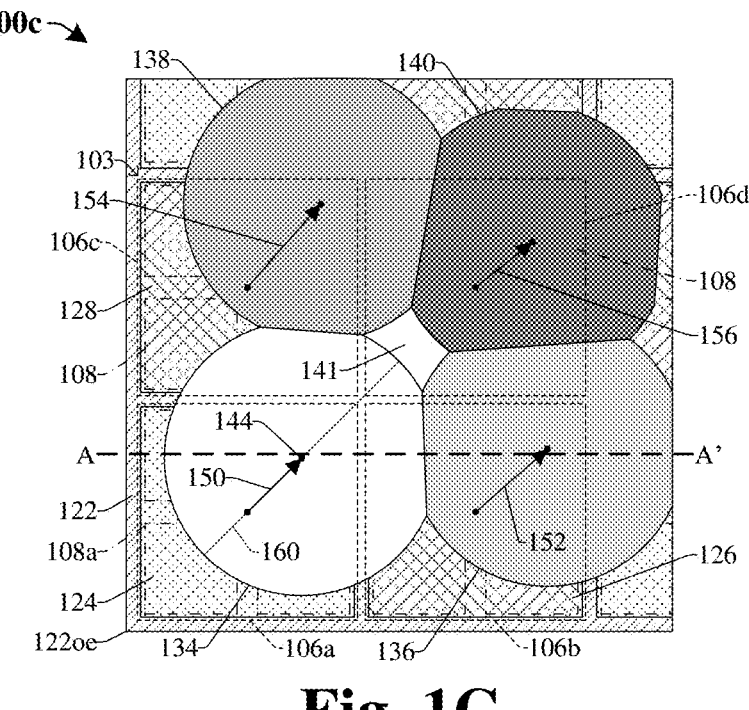
Figure 1D:
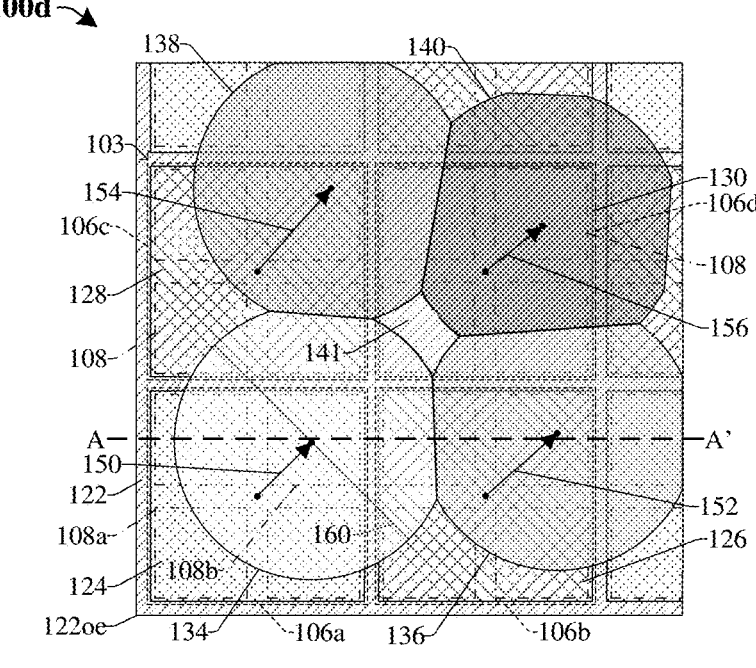

FIGS. 1A-1D illustrate various views of some embodiments of an imaging device including an image sensor 103 having a plurality of image sensor elements 106a-d and a plurality of micro-lenses 134-140 having different lens shift amounts. The image sensor elements 106a-d comprise one or more pixel unit(s) having one or more photodetector(s) 108 disposed within a semiconductor substrate 102. FIG. 1A illustrates a cross-sectional view 100a of some embodiments of the imaging device. FIG. 1B illustrates a top view 100b of some embodiments of the imaging device taken along the line A-A' of FIG. 1A. FIG. 1C illustrates a top view 100c of some embodiments of the imaging device taken along the line B-B' of FIG. 1A. FIG. 1D illustrates a top view 100d of some embodiments of the imaging device taken along the line B-B' of FIG. 1A, where various structures (e.g., micro-lenses 134-140 and/or portion(s) of upper dielectric layer 132) of the imaging device are at least partially transparent for ease of illustration.

The imaging device comprises a semiconductor substrate 102 having a front-side surface 102f opposite a back-side surface 102b. The semiconductor substrate 102 may, for example, be or comprise silicon, monocrystalline silicon, bulk silicon, epitaxial silicon, germanium, silicon germanium, another semiconductor material, or any combination of the foregoing and has a first doping type (e.g., p-type). An image sensor 103 comprises a plurality of image sensor elements 106a-d disposed in the semiconductor substrate 102. In some embodiments, the image sensor elements 106a-d each comprise a pixel unit having a plurality of photodetectors 108. For example, each pixel unit may comprise four photodetectors 108 arranged in a 2×2 layout. The photodetectors 108 have a second doping type (e.g., n-type) opposite the first doping type. Further, the photodetectors 108 are configured to absorb incident light (e.g., photons) and generate respective electrical signals corresponding to the incident light.

An interconnect structure 104 and a plurality of pixel devices 110 are disposed on the front-side surface 102f of the semiconductor substrate 102. The plurality of pixel devices 110 may, for example, be or comprise transfer transistor(s), reset transistor(s), source-follower transistor(s), select transistor(s), or the like. The plurality of pixel devices 110 are configured to facilitate readout of accumulated charge from the photodetectors 108. The interconnect structure 104 comprises a plurality of conductive vias 112 and a plurality of conductive wires 114 disposed within an interconnect dielectric structure 116. The plurality of conductive vias and wires 112, 114 are electrically coupled to the plurality of pixel devices 110.

An isolation structure 118 is disposed in the semiconductor substrate 102 and is spaced between adjacent photodetectors 108. In some embodiments, the isolation structure 118 continuously extends from the back-side surface 102b of the semiconductor substrate 102 to a point below the back-side surface 102b. Further, a passivation layer 120 is disposed on the back-side surface 102b of the semiconductor substrate 102. A grid structure 122 overlies the passivation layer 120. The grid structure 122 may comprise a dielectric grid structure and/or a metal grid structure vertically stacked with one another. In some embodiments, the grid structure 122 extends around a perimeter of a corresponding pixel unit.

A light filter array overlies the passivation layer 120 and comprises a plurality of light filters 124-130. The light filters 124-130 overlie a corresponding pixel unit of the image sensor elements 106a-d and are each configured to pass a first range of wavelengths while blocking a second range of wavelengths different from the first range of wavelengths. In some embodiments, the grid structure 122 laterally wraps around each light filter in the light filter array. The plurality of light filters 124-130 comprises a first light filter 124, a second light filter 126, a third light filter 128, and a fourth light filter 130. In various embodiments, the image sensor elements 106a-d of the image sensor 103 are arranged in a Bayer pattern comprising a first image sensor element 106a, a second image sensor element 106b, a third image sensor element 106c, and a fourth image sensor element 106d. In such embodiments, the first image sensor element 106a may be configured as a blue image sensor element, the second image sensor element 106b may be configured as a first green image sensor element, the third image sensor element 106c may be configured as a second green image sensor element, and the fourth image sensor element 106d may be configured as a red image sensor element. In some embodiments, the first light filter 124 may be configured as a blue light filter (e.g., configured to pass blue light), the second light filter 126 may be configured as a first green light filter (e.g., configured to pass green light), the third light filter 128 may be configured as a second green light filter (e.g., configured to pass green light), and the fourth light filter 130 may be configured as a red light filter (e.g., configured to pass red light). In various embodiments, a center of each light filter 124-130 is aligned with a center of a corresponding pixel unit of a corresponding image sensor element. For example, a center of the first light filter 124 is aligned with a center of the pixel unit of the first image sensor element 106a, where the center of the pixel unit of the first image sensor element 106a is arranged at a cross-road of adjacent photodetectors 108 of the pixel unit of the first image sensor element 106a.

An upper dielectric layer 132 overlies the grid structure 122 and the plurality of light filters 124-130. Further, a micro-lens array having a plurality of micro-lenses 134-140 is disposed over the light filter array. Each micro-lens 134-140 has a curved upper surface and is configured to direct incident light towards a corresponding pixel unit of an underlying image sensor element 106a-d. In various embodiments, the upper dielectric layer 132 has a flat upper surface and may comprise a same material as the plurality of micro-lenses 134-140. The plurality of micro-lenses 134-140 comprises a first micro-lens 134, a second micro-lens 136, a third micro-lens 138, and a fourth micro-lens 140. In some embodiments, the first micro-lens 134 is configured to direct light towards the pixel unit of the first image sensor element 106a. By virtue of a variety of factors, such as differences in refractive indices of the light filters 124-130, differences in spot sizes of different wavelengths of light, differences in CRAs of the micro-lenses 134-140, etc., optimal lens shift amounts for the micro-lens 134-140 relative to corresponding image sensor elements 106a-d are different from one another. Thus, centers of the micro-lenses 134-140 are each laterally offset or shifted from the center of a corresponding pixel unit in the plurality of image sensor elements 106a-d by a different distance and/or direction to optimize performance of the corresponding pixel unit. For example, as illustrated in the cross-sectional view 100a of FIG. 1A, a center 144 of the first micro-lens is laterally separated from a center 142 of the pixel unit of the first image sensor element 106a by a first shift distance Ld1. Further, a center 148 of the second micro-lens is laterally separated from a center 146 of the pixel unit of the second image sensor element 106b by a second shift distance Ld2, where the first shift distance Ld1 is different from the second shift distance Ld2. As a result of the micro-lenses 134-140 being laterally offset or shifted by different amounts, pitches, spacing, areas, and/or shapes of the micro-lenses 134-140 across the micro-lens array are different from one another. Because the laterally offset or shift of each micro-lens 134-140 is optimized for the corresponding underlying pixel unit, a performance (e.g., sensitivity, full well capacity, etc.) of the image sensor elements 106a-d, a uniformity of incident light across the imaging device, and an accuracy of images produced from the imaging device are improved.

As illustrated in the top views 100c and 100d of FIGS. 1C and 1D, centers of the micro-lenses 134-140 are each laterally offset or shifted from the center of a corresponding pixel unit of the image sensor elements 106a-d by vectors 150-156 that represent lens shift amounts of the micro-lenses 134-140. In various embodiments, a center of the first micro-lens 134 is laterally offset or shifted from a center of the pixel unit of the first image sensor element 106a by a first vector 150; a center of the second micro-lens 136 is laterally offset or shifted from a center of the pixel unit of the second image sensor element 106b by a second vector 152; a center of the third micro-lens 138 is laterally offset or shifted from a center of the pixel unit of the third image sensor element 106c by a third vector 154; and a center of the fourth micro-lens 140 is laterally offset or shifted from a center of the pixel unit of the fourth image sensor element 106d by a fourth vector 156. In some embodiments, the center of each micro-lenses 134-140 is defined at a midpoint of a straight line extending between two opposing curved sidewalls of the corresponding micro-lens. For example, the center 144 of the first micro-lens 134 is defined at a midpoint of a straight line 160 continuously extending between opposing curved sidewalls of the first micro-lens 134.

In some embodiments, magnitudes and/or directions of the vectors 150-156 are different from one another. For example, a magnitude of the first vector 150 is less than a magnitude of the second vector 152, such that the center of the second micro-lens 136 is shifted from the center of the pixel unit of the second image sensor element 106b by a greater distance than the center of the first micro-lens 134 is shifted from the center of the pixel unit of the first image sensor element 106a. Further, it will be appreciated that the image sensor 103 may be part of an array of image sensors disposed in a plurality of rows and columns of image sensors, where a center of the array of image sensors is diagonal to an outer edge 122oe of the grid structure 122. In some embodiments, a module lens (not shown) overlies the array of image sensors, and in an effort to adjust for a CRA of the module lens the centers of the micro-lenses 134-140 are each laterally offset or shifted in a direction towards the center of the array of image sensors (e.g., in a direction away from the outer edge 122oe of the grid structure 122). In further embodiments, the direction of the shift of each micro-lens 134-140 may be different to optimize performance of the corresponding image sensor element 106a-d, thereby increasing an overall performance of the image sensor 103.

In further embodiments, areas of the plurality of micro-lenses 134-140 are different from each other. For example, the first micro-lens 134 has a first area greater than a second area of the second micro-lens 136. In yet further embodiments, shapes of the micro-lenses 134-140 are different from each other. For example, the first micro-lens 134 has a first shape comprising at least two curved sidewalls and at least two straight sidewalls, and the second micro-lens 136 has a second shape comprising at least three curved sidewalls and at least three straight sidewalls such that the first shape is different from the second shape. In some embodiments, the third micro-lens 138 has a third shape comprising at least three curved sidewalls and at least three straight sidewalls, where the straight and curved sidewalls of the third micro-lens 138 have different lengths and/or arclengths than the straight and curved sidewalls of the second micro-lens 136 such that the third shape is different from the second shape. In addition, a gap 141 is defined between sidewalls of the plurality of micro-lenses 134-140. In some embodiments, the gap 141 may correspond to a segment of the upper dielectric layer 132 extending between the sidewalls of the plurality of micro-lenses 134-140, where the upper dielectric structure 132 has a flat upper surface. In various embodiments, by virtue of the micro-lenses having different shifts, a shape of the gap 141 may be irregular and/or asymmetrical.

In some embodiments, the first micro-lens 134 comprises a first curved sidewall adjacent to a first straight sidewall, where the first straight sidewall of the first micro-lens 134 contacts the second micro-lens 136. The first micro-lens 134 further comprises a second straight sidewall in contact with the third micro-lens 138, where a length of the first straight sidewall is different from a length of the second straight sidewall. In various embodiments, the pixel unit of the first image sensor element 106a comprises a first photodetector 108a diagonally opposite a second photodetector 108b, where the first micro-lens 134 directly overlies an entirety of the second photodetector 108b and the first micro-lens 134 is laterally offset from at least an outer region of the first photodetector 108a. In yet further embodiments, the first micro-lens 134 is laterally offset from more than half of an area of a top of the first photodetector 108a. In further embodiments, the first micro-lens 134 directly overlies at least a portion of the plurality of photodetectors 108 of the pixel unit of the second image sensor element 106b.

Figures 2A, 2B:
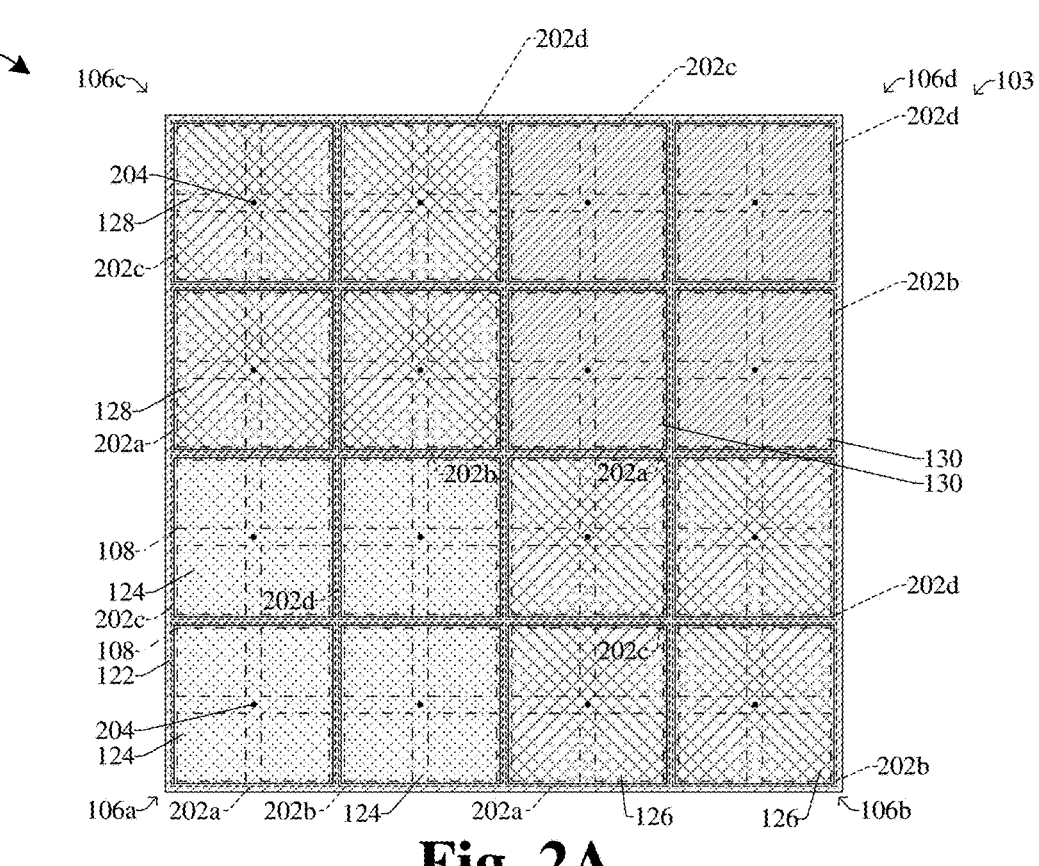
FIGS. 2A-2C through 4A-4B illustrate top views of some embodiments of an imaging device corresponding to some different embodiments of the imaging device of FIGS. 1A-1D.
Figure 2C:
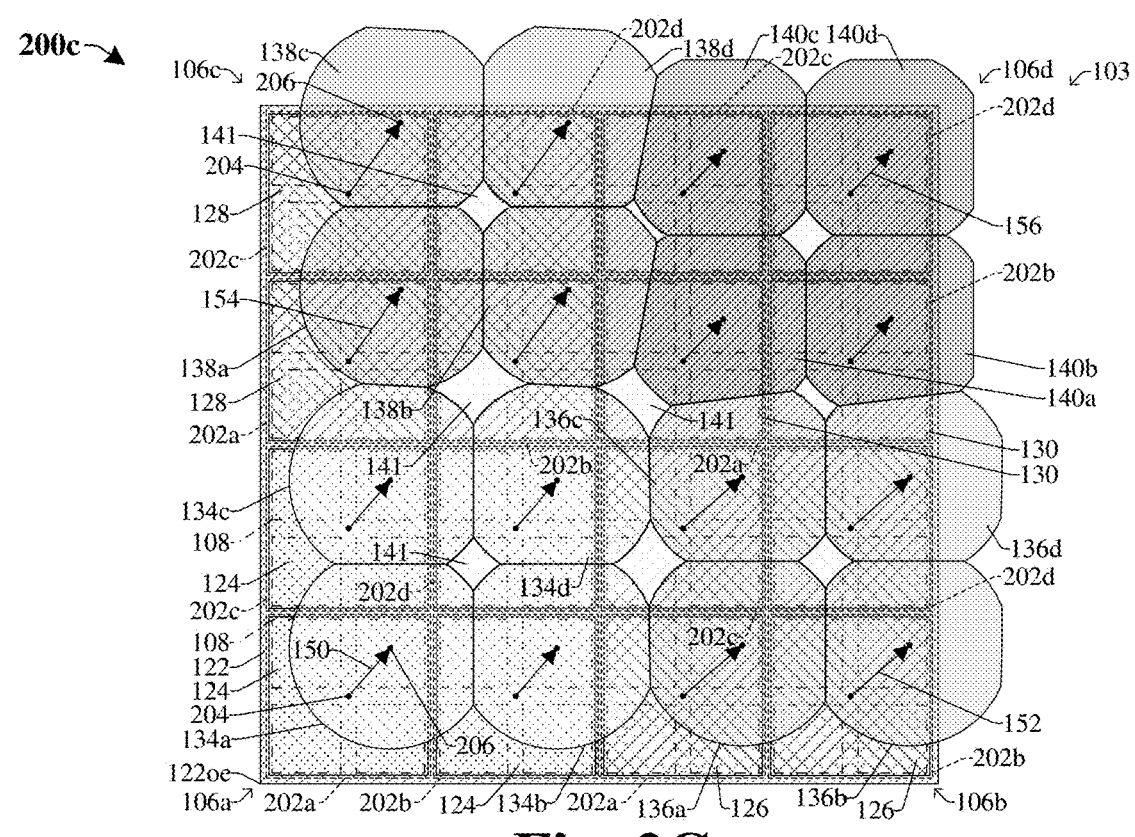

FIGS. 2A-2C illustrate various top views 200a-200c of some embodiments of an imaging device corresponding to some alternative embodiments of the imaging device of FIGS. 1A-1D, where each image sensor element 106a-d comprises a plurality of pixel units 202a-d. Each pixel unit 202a-d of the image sensor element 106a-d comprise a plurality of photodetectors 108 disposed within a semiconductor substrate 102. FIG. 2A illustrates the top view 200a of some embodiments of the imaging device taken along a top surface of the plurality of light filters 124-130. FIGS. 2B and 2C illustrate the top views 200b and 200c of some embodiments of the imaging device taken along a top surface of the array of micro-lenses, where various structures (e.g., micro-lenses 134-140, portions of the upper dielectric layer 132, etc.) are at least partially transparent in the top view 200c of FIG. 2C for ease of illustration.

In some embodiments, a plurality of first light filters 124 overlies the pixel units 202a-d of the first image sensor element 106a; a plurality of second light filters 126 overlies the pixel units 202a-d of the second image sensor element 106b; a plurality of third light filters 128 overlies the pixel units 202a-d of the third image sensor element 106c; and a plurality of fourth light filters 130 overlies the pixel units 202a-d of the fourth image sensor element 106d. In various embodiments, the plurality of first light filters 124 may be configured as a blue light filter, the plurality of second light filters 126 may be configured as first green light filters, the plurality of third light filters 128 may be configured as second green light filters, and the plurality of fourth light filters 130 may be configured as red light filters.

In yet further embodiments, a plurality of first micro-lenses 134a-d overlies the first image sensor element 106a, where the first micro-lenses 134a-d are configured to direct incident light towards a corresponding pixel unit 202a-d in the first image sensor element 106a. For example, the first micro-lens 134a is configured to direct light towards the pixel unit 202a of the first image sensor element 106a, the first micro-lens 134b is configured to direct light towards the pixel unit 202b of the first image sensor element 106a, and so on. A plurality of second micro-lenses 136a-d overlies the second image sensor element 106b, where the second micro-lenses 136a-d are configured to direct incident light towards a corresponding pixel unit 202a-d in the second image sensor element 106b. A plurality of third micro-lenses 138a-c overlies the third image sensor element 106c, where the third micro-lenses 138a-c are configured to direct incident light towards a corresponding pixel unit 202a-d in the third image sensor element 106c. A plurality of fourth micro-lenses 140a-d overlies the fourth image sensor element 106d, where the fourth micro-lenses 140a-d are configured to direct incident light towards a corresponding pixel unit 202a-d in the fourth image sensor element 106d.

In various embodiments, centers of the first micro-lenses 134a-d are laterally offset or shifted from the center of a corresponding pixel unit 202a-d of the first image sensor element 106a by first vectors 150. For example, a center 206 of the first micro-lens 134a is shifted from a center 204 of the pixel unit 202a of the first image sensor element 106a by the first vector 150. In some embodiments, the first vectors 150 each have a same magnitude and direction. Centers of the second micro-lenses 136a-d are laterally offset or shifted from the center of a corresponding pixel unit 202a-d of the second image sensor element 106b by second vectors 152. In some embodiments, the second vectors 152 have a same magnitude and direction. Centers of the third micro-lenses 138a-d are laterally offset or shifted from the center of a corresponding pixel unit 202a-d of the third image sensor element 106c by third vectors 154. In some embodiments, the third vectors 154 have a same magnitude and direction. Centers of the fourth micro-lenses 140a-d are laterally offset or shifted from the center of a corresponding pixel unit 202a-d of the fourth image sensor element 106d by fourth vectors 156. In some embodiments, the fourth vectors 156 have a same magnitude and direction. In some embodiments, the first vectors 150, the second vectors 152, the third vectors 154, and the fourth vectors 156 are each different from one another such that the laterally offsets or shifts of the first, second, third, and fourth micro-lenses 134a-d, 136a-d, 138a-d, 140a-d are different from one another. The first vectors 150, the second vectors 152, the third vectors 154, and the fourth vectors 156 correspond to lens shift amounts of the first, second, third, and fourth micro-lenses 134a-d, 136a-d, 138a-d, 140a-d.

By virtue of the shifts of the micro-lenses over each image sensor element 106a-d being the same, gaps 141 between the micro-lenses of a corresponding image sensor element 106a-d are symmetrical. For example, the center of each micro-lens in the plurality of first micro-lenses 134a-d is shifted from the center of a corresponding pixel unit 202a-d of the first image sensor element 106a by the first vectors 150 that are equal (e.g., in magnitude and direction) to one another, such that a shape of a first gap 141a spaced between the plurality of first micro-lenses 134a-d is symmetrical. Further, due to the vectors 150-156 being different from one another, the shape and/or area of gaps 141 between the pluralities of micro-lenses 134a-d, 136a-d, 138a-d, 140a-d are different from one another. For example, the shape and/or area of the first gap 141a is different from a shape and/or area of a second gap 141b spaced between the plurality of second micro-lenses 136a-d. In yet further embodiments, due to the first vectors 150, the second vectors 152, the third vectors 154, and the fourth vectors 156 being different from one another, shapes of gaps 141 between adjacent pluralities of micro-lenses are irregular and/or asymmetrical. For example, a shape of a third gap 141c between the plurality of first micro-lenses 134a-d and the plurality of third micro-lenses 138a-d is irregular and/or asymmetrical.

Figure 3A:
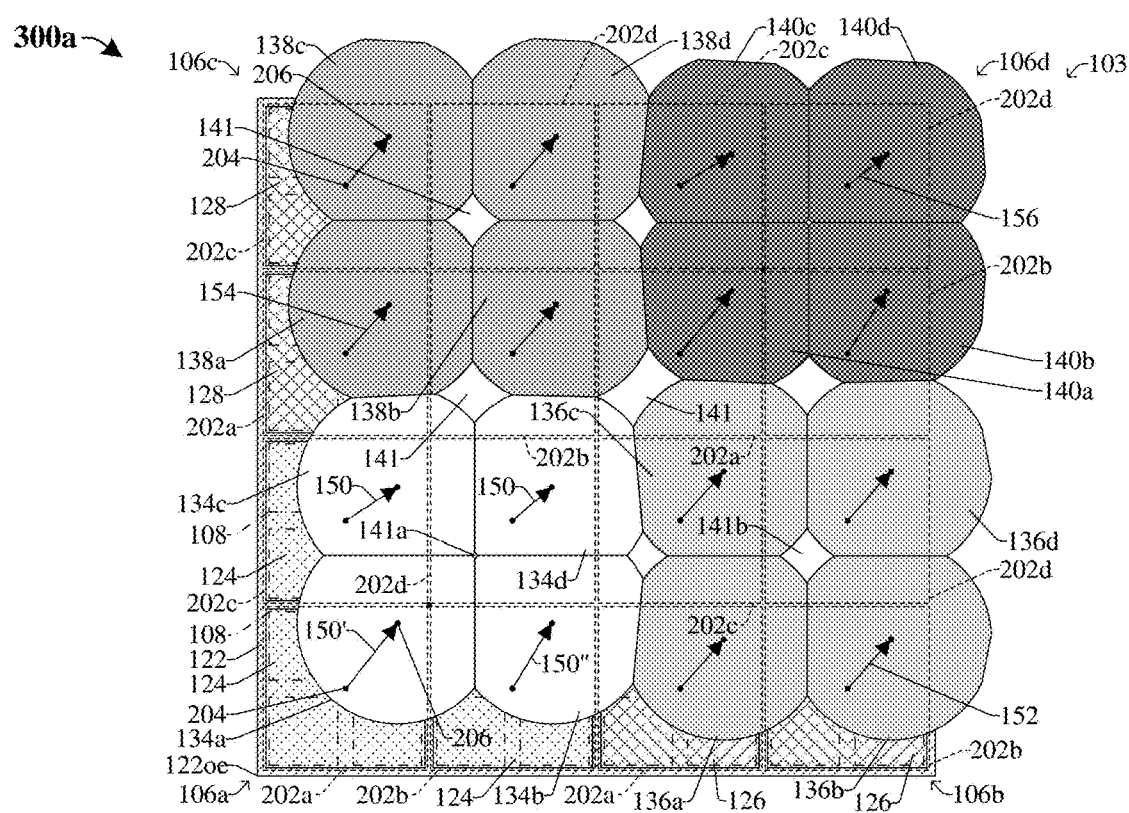
Figure 3B:
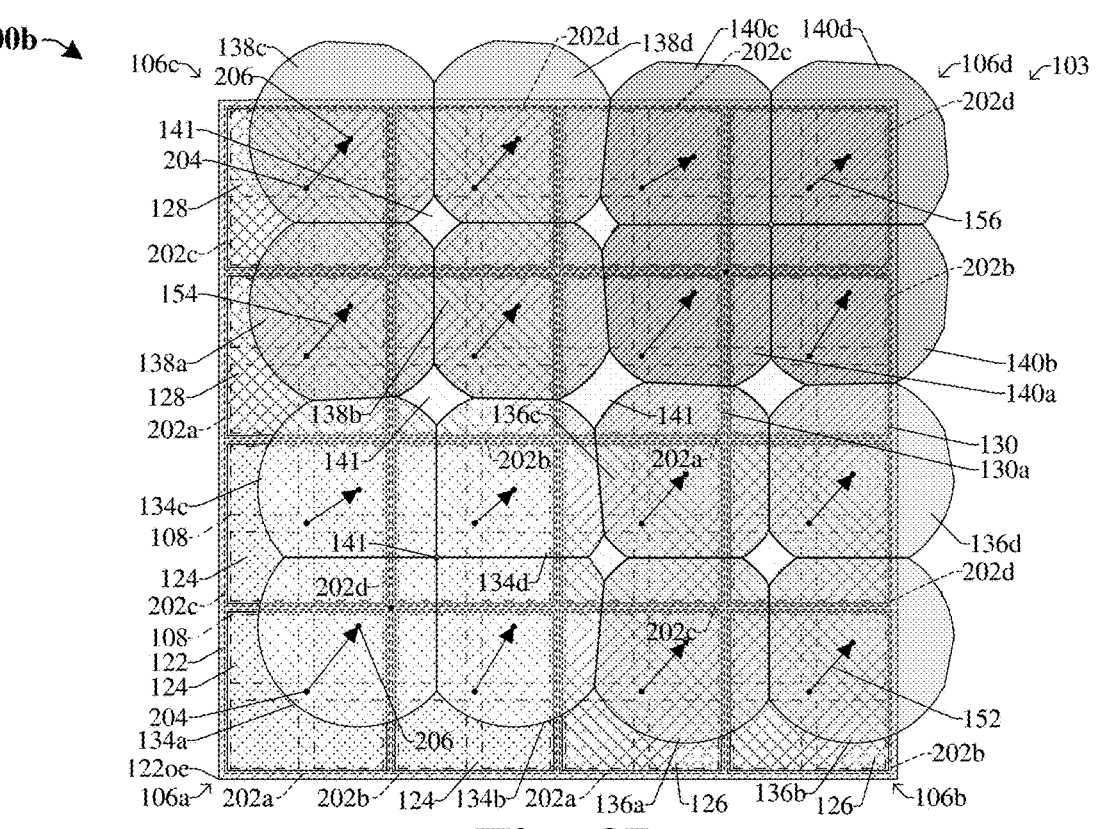

FIGS. 3A and 3B illustrate top views 300a and 300b of some embodiments of an imaging device corresponding to some alternative embodiments of the imaging device of FIGS. 2A-2C, where the plurality of first micro-lenses 134a-d and the plurality of fourth micro-lenses 140a-d are shifted towards one another (e.g., an inward shift) and the plurality of second micro-lenses 136a-d and the plurality of third micro-lenses 138a-d are shifted away from one another (e.g., an outward shift). FIGS. 3A and 3B illustrate the top views 300a and 300b of some embodiments of the imaging device taken along a top surface of the plurality of micro-lenses 134-140, where various structures (e.g., the micro-lenses 134-140, portions of the upper dielectric layer 132, etc.) are at least partially transparent in the top view 300b of FIG. 3B for ease of illustration.

In various embodiments, the plurality of first micro-lenses 134a-d and the plurality of fourth micro-lenses 140a-d are shifted inward towards one another such that the first vectors 150 and the fourth vectors 156 are different from one another. For example, the first vector 150' corresponding to the lens shift amount of the first micro-lens 134a is different from the first vector 150" corresponding to the lens shift amount of the first micro-lens 134b. In yet further embodiments, the plurality of second micro-lenses 136a-d and the plurality of third micro-lenses 138a-d are shifted outward away from one another relative to the shift of the plurality of first or fourth micro-lenses 134a-d, 140a-d. In some embodiments, the second vectors 152 are equal to one another and the third vectors 154 are equal to one another. As a result of the first micro-lenses 134a-d being shifted inward toward one another and the second micro-lenses 136a-d being shifted outward away from one another, the first gap 141a is smaller than the second gap 141b.

Figure 4A:
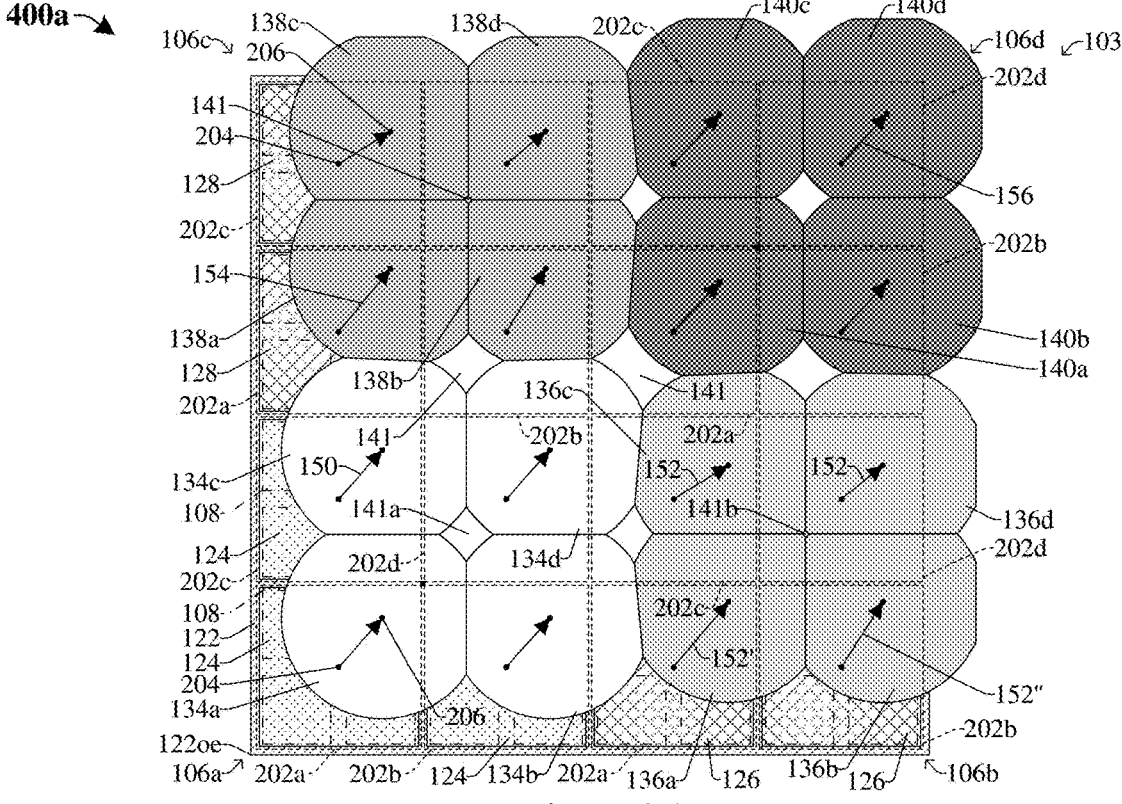
Figure 4B:
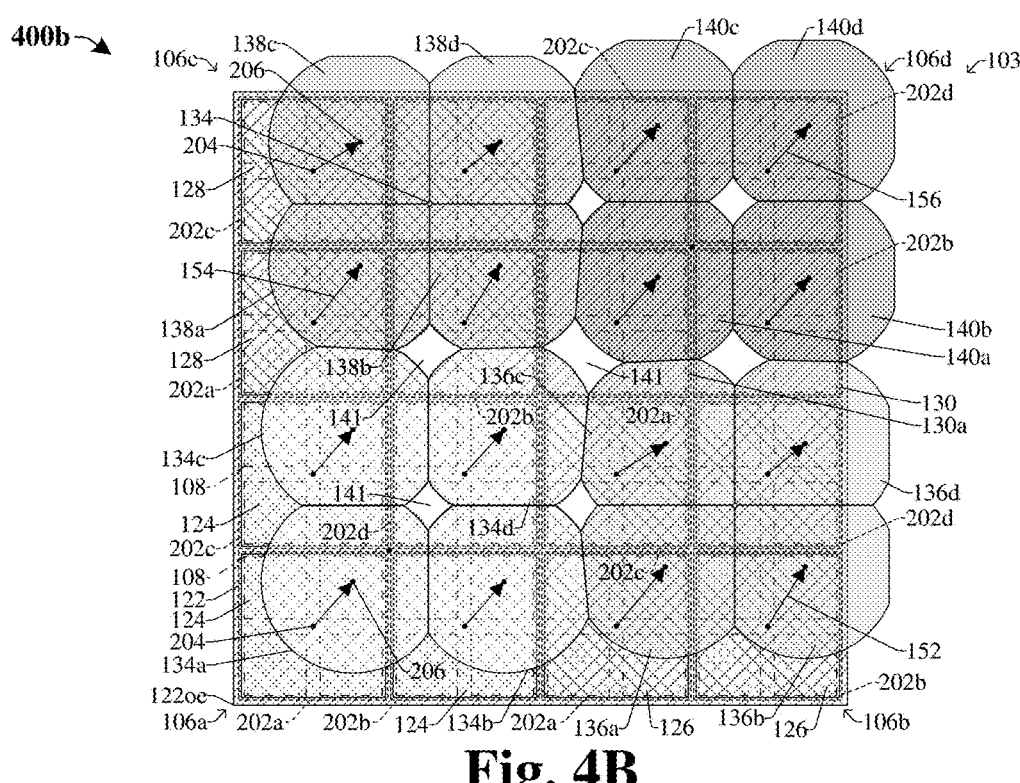

FIGS. 4A and 4B illustrate top views 400a and 400b of some embodiments of an imaging device corresponding to some alternative embodiments of the imaging device of FIGS. 2A-2C, where the plurality of first micro-lenses 134a-d and the plurality of fourth micro-lenses 140a-d are shifted away from one another (e.g., an outward shift) and the plurality of second micro-lenses 136a-d and the plurality of third micro-lenses 138a-d are shifted towards one another (e.g., an inward shift). FIGS. 4A and 4B illustrate the top views 400a and 400b of some embodiments of the imaging device taken along a top surface of the plurality of micro-lenses 134-140, where various structures (e.g., the micro-lenses 134-140, portions of the upper dielectric layer 132, etc.) are at least partially transparent in the top view 400b of FIG. 4B for ease of illustration.

In various embodiments, the plurality of first micro-lenses 134a-d and the plurality of fourth micro-lenses 140a-d are shifted outward away from one another. In some embodiments, the first vectors 150 are equal to one another and the fourth vectors 156 are equal to one another. In yet further embodiments, the plurality of second micro-lenses 136a-d and the plurality of third micro-lenses 138a-d are shifted inward towards one another, such that the second vectors 152 are different from one another and the third vectors 154 are different from one another. For example, the second vector 152' corresponding to the shift of the second micro-lens 136a is different from the second vector 152" corresponding to the shift of the second micro-lens 136b. As a result of the first micro-lenses 134a-d being shifted outward away from one another and the second micro-lenses 136a-d being shifted inward towards one another, the first gap 141a is larger than the second gap 141b.

Figure 5A:
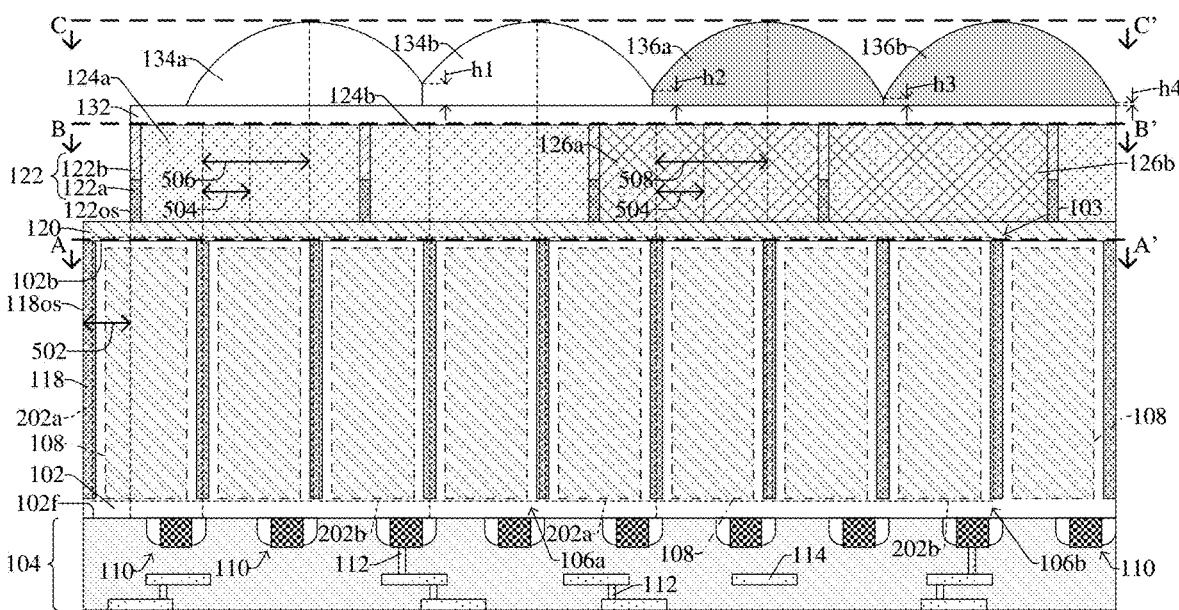
FIGS. 5A-5E illustrate various views of some embodiments of an imagining device comprising a grid structure laterally offset or shifted from an overlying grid structure.
Figure 5B:
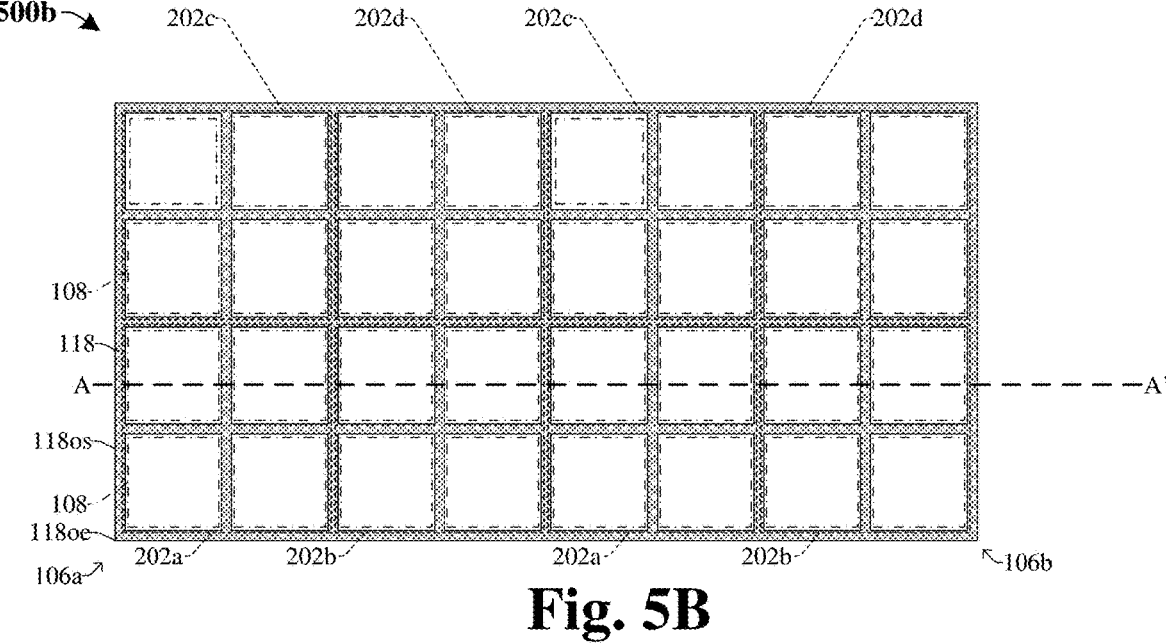
Figure 5C:
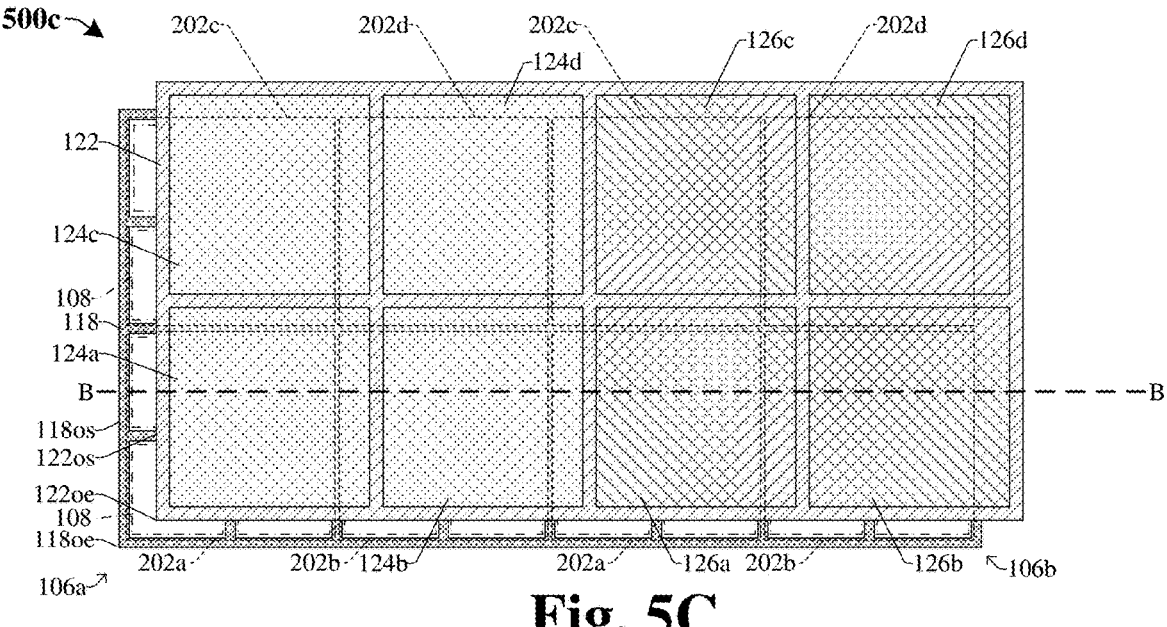
Figure 5D:
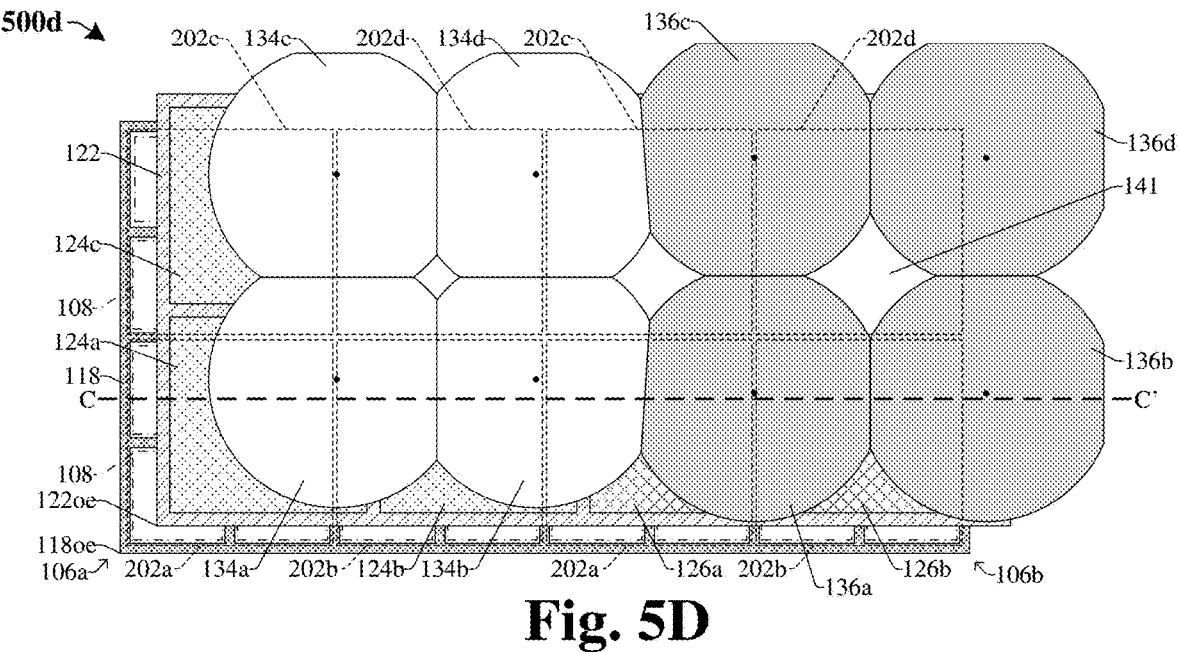
Figure 5E:
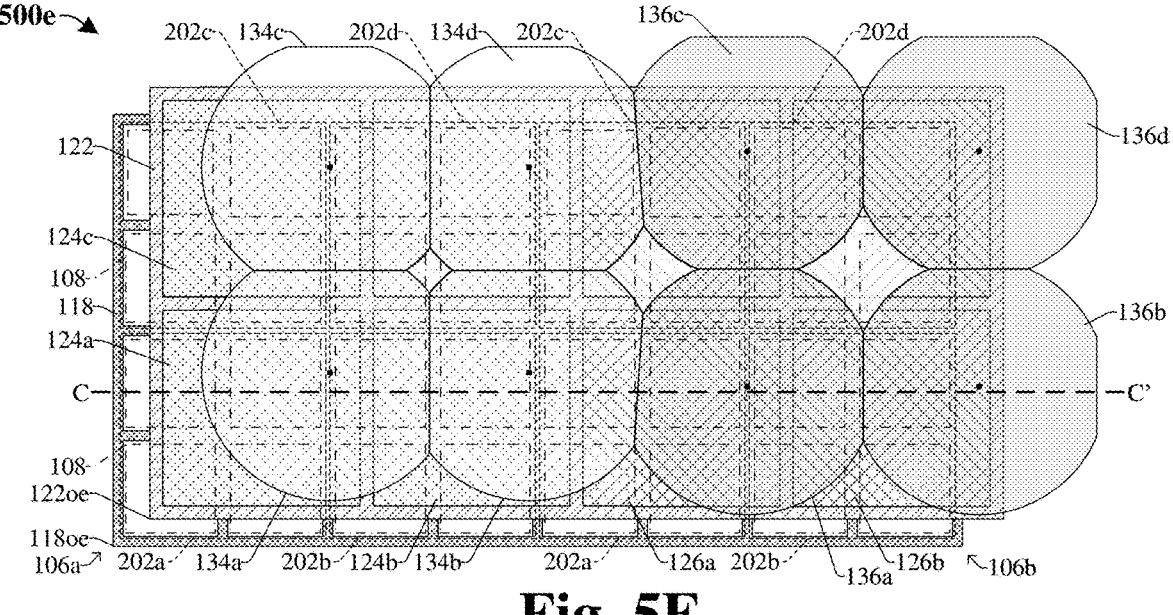

FIGS. 5A-5E illustrate various views of some embodiments of an imaging device corresponding to some alternative embodiments of the imaging device of FIGS. 1A-1D, where an outer sidewall 122os of the grid structure 122 is laterally offset or shifted from an outer sidewall 118os of the isolation structure 118 by a grid shift amount 502. In various embodiments, while only the first and second image sensor elements 106a-b are illustrated in the FIGS. 5A-5E it will be appreciated that the image sensor 103 may further comprise the third and fourth image sensor elements 106c-d as illustrated and/or described in FIG. 1A-1D, 2A-2C, 3A-3B, or 4A-4B. FIG. 5A illustrates a cross-sectional view 500a of some embodiments of the imaging device. FIG. 5B illustrates a top view 500b of some embodiments of the imaging device taken along the line A-A' of FIG. 5A. FIG. 5C illustrates a top view 500c of some embodiments of the imaging device taken along the line B-B' of FIG. 5A. FIG. 5D illustrates a top view 500d of some embodiments of the imaging device taken along the line C-C' of FIG. 5A. FIG. 5E illustrates top view 500e of some embodiments of the imaging device taken along the line C-C' of FIG. 5A, where various structures (e.g., micro-lenses 134-136 and/or portions of upper dielectric layer 132) of the imaging device are at least partially transparent for ease of illustration.

In some embodiments, the grid structure 122 comprises a plurality of grid openings that overlie a corresponding pixel unit 202a-d in the first or second image sensor elements 106a-b. Further, a plurality of first light filters 124a-d and a plurality of second light filters 126a-d are disposed within the plurality of grid openings and are laterally offset or shifted from a corresponding pixel unit 202a-d in the first or second image sensor elements 106a-b. The grid openings are laterally offset or shifted from a corresponding pixel unit 202a-d by grid opening shift amounts 504. In some embodiment, the grid opening shift amounts 504 are equal to one another and/or are equal to the grid shift amount 502. In yet further embodiments, the grid opening shift amounts 504 may vary depending on a pixel unit position within the array of image sensor elements, where the grid opening shift amounts 504 may be different from the grid shift amount 502. For instance, the grid opening shift amounts 504 from each pixel unit 202a-d may be proportional to a pixel unit distance from a center of the array of image sensor elements, such that the grid opening shift amounts 504 may be the greatest at a periphery of the array of image sensor elements. In yet further embodiments, the center of the array of image sensor elements is diagonal to the outer edge 122oe of the grid structure 122 and an outer edge 118oe of the isolation structure 118. Shifting the plurality of grid openings based on the pixel unit position increases the uniformity of incident light to the pixel units 202a-d. Instead of blocking certain incident light, the grid structure 122 may better direct the light to the photodetectors 108 of each pixel unit 202a-d. For example, a light ray may enter a first light filter 124a at a steep angle of incidence, while still having a direct path to a photodetector 108 of the corresponding pixel unit 202a of the first light filter 124a. Thus, shifting the grid structure openings based on pixel unit positions increases an overall optical performance (e.g., by increasing the signal to noise ratio) of the imagining device.

In further embodiments, centers of the first micro-lenses 134a-d are laterally offset or shifted from centers of corresponding pixel units 202a-d of the first image sensor elements 106a by first lens shift amounts and centers of the second micro-lenses 136a-d are laterally offset or shifted from centers of corresponding pixel units 202a-d of the second image sensor elements 106b by second lens shift amounts, where the first lens shift amounts are different from the second lens shift amounts. For example, the first micro-lens 134a is laterally offset or shifted from a center of the pixel unit 202a of the first image sensor element 106a by a first lens shift amount 506, and the second micro-lens 136a is laterally offset or shifted from a center of the pixel unit 202a of the second image sensor element 106b by a second lens shift amount 508 different from the first lens shift amount 506. In some embodiments, the grid structure 122 and the plurality of micro-lenses 134a-d, 136a-d are shifted independent from one another, thereby increasing design flexibility and an overall performance of the imaging device.

In addition, due to the difference in lens shift amounts, a first sidewall of the first micro-lens 134a has a first height h1 and a second sidewall of the first micro-lens 134b has a second height h2, where the first height h1 is greater than the second height h2. Further, the first sidewall of the first micro-lens 134a neighbors the second sidewall of the first micro-lens 134b. A first sidewall of the second micro-lens 136a has a third height h3 that is less than the second height h2 of the second sidewall of the first micro-lens 134b. A second sidewall of the second micro-lens 136b has a fourth height h4 that is less than the third height h3 of the first sidewall of the second micro-lens 136a. In various embodiments, a ratio of heights of neighboring sidewalls in the micro-lenses 134a-d, 136a-d is greater than 0.40, within a range of about 0.40 to about 1, or some other suitable value. For example, a ratio (e.g., h2/h1) of the second height h2 and the first height h1 is greater than about 0.40.

In yet further embodiments, the grid structure 122 comprises a first grid layer 122a vertically stacked with a second grid layer 122b. The first grid layer 122a may, for example, be or comprise a metal material such as aluminum, copper, tungsten, another conductive material, or any combination of the foregoing. The second grid layer 122b may, for example, be or comprise a dielectric material such as silicon dioxide, silicon nitride, a metal oxide, another dielectric material, or any combination of the foregoing. In yet further embodiments, the first grid layer 122a may overlie the second grid layer 122b (not shown).

Figure 6A:
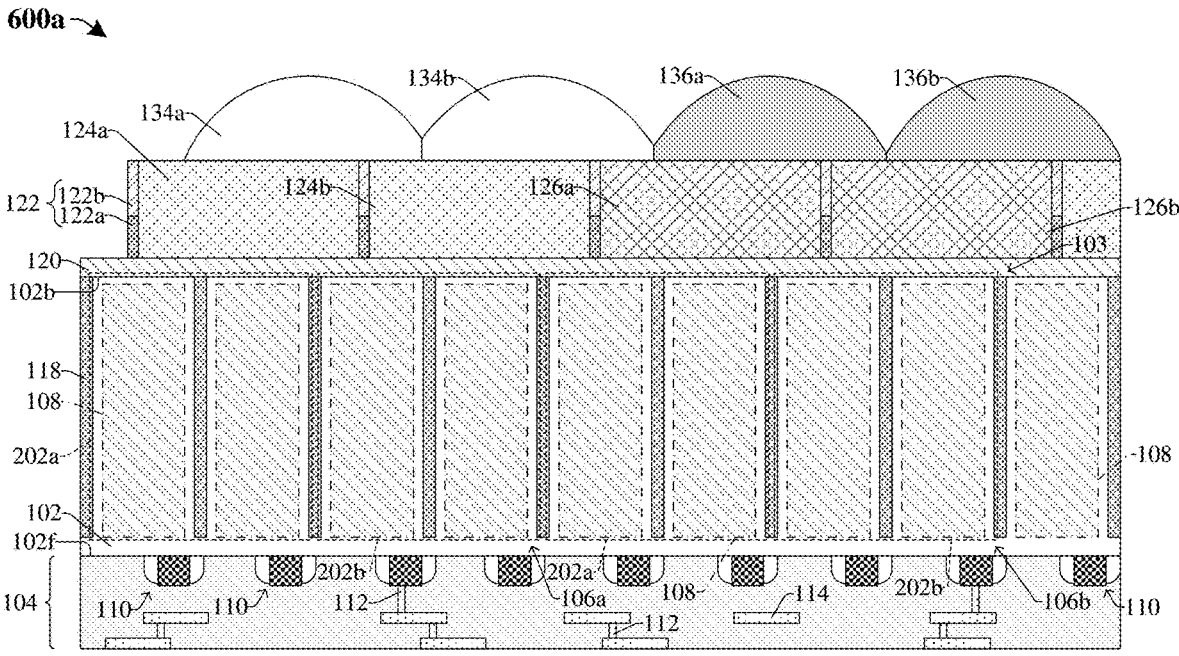
FIGS. 6A-6B illustrate cross-sectional views of some embodiments of an imaging device corresponding to some other embodiments of the imaging device of FIGS. 5A-5E.

FIG. 6A illustrates a cross-sectional view 600a of some embodiments of an imaging device corresponding to some alternative embodiments of the imaging device of FIGS. 5A-5E, where the upper dielectric layer (132 of FIG. 5A) is omitted and the plurality of first and second micro-lenses 134a-d, 136a-d contact the grid structure 122 and the light filters 124a-d, 126a-d.

Figure 6B:
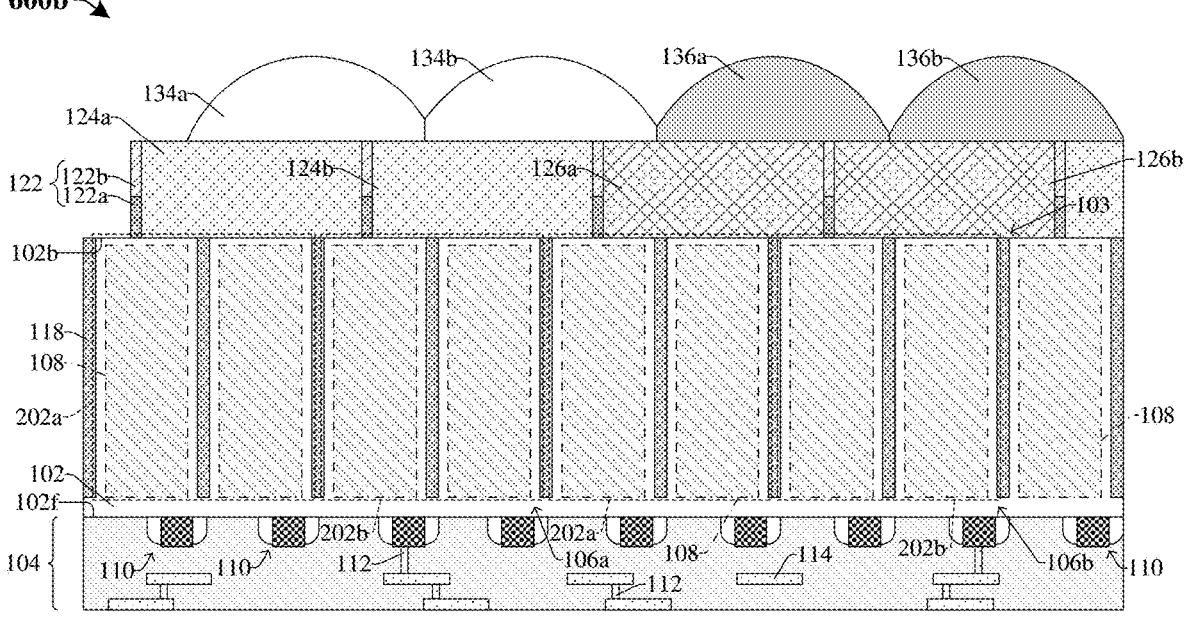

FIG. 6B illustrates a cross-sectional view 600b of some embodiments of an imaging device corresponding to some alternative embodiments of the imaging device of FIG. 6A, where the passivation layer (120 of FIG. 6A) is omitted and the grid structure 122 contacts the back-side surface 102b of the semiconductor substrate 102.

Figures 7A, 7B:
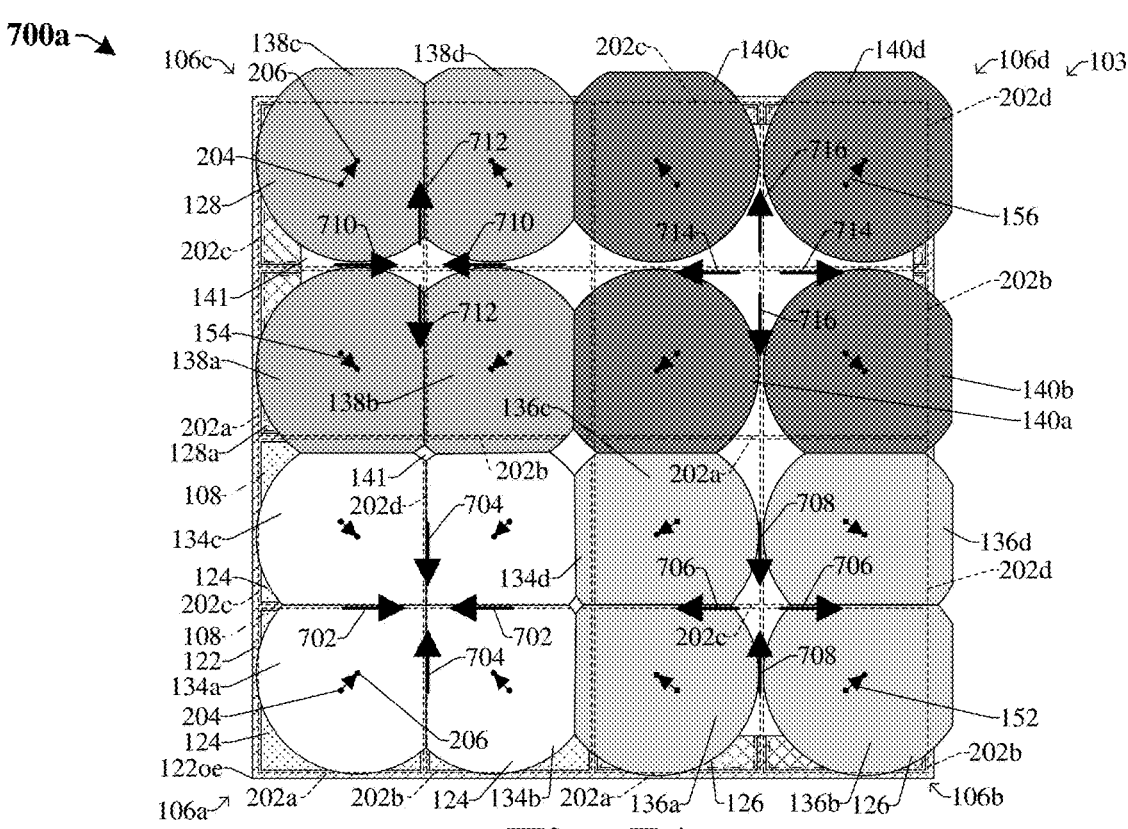
FIGS. 7A-7B through FIGS. 13A-13C illustrate top views of some embodiments of an imaging device corresponding to some other embodiments of the imaging device of FIGS. 2A-2C.

FIGS. 7A-7B illustrate top views 700a and 700b of some embodiments of an imaging device corresponding to some alternative embodiments of the imaging device of FIGS. 2A-2C, where the plurality of first, second, third, and fourth micro-lenses 134a-d, 136a-d, 138a-d, 140a-d have different lateral offsets or shifts with corresponding pixel units 202a-d. FIGS. 7A and 7B illustrate the top views 700a and 700b of some embodiments of the imaging device taken along a top surface of the micro-lens array, where various structures (e.g., the micro-lenses, portions of the upper dielectric layer, etc.) are at least partially transparent in the top view 700b of FIG. 7B for ease of illustration.

In some embodiments, the micro-lens array is laterally offset or shifted from the outer edge 122oe of the grid structure 122 in a direction towards a center of the array of image sensor elements. The micro-lens array comprises the plurality of first, second, third, and fourth micro-lenses 134a-d, 136a-d, 138a-d, 140a-d that each have different lateral offsets or shifts with corresponding pixel units 202a-d of the image sensor elements 106a-d. In some embodiments, the first micro-lenses 134a-d are laterally offset or shifted inwards towards one another as illustrated by the arrows 702, 704. In such embodiments, the first micro-lenses 134a-d are laterally offset or shifted towards a center of the first image sensor element 106a. The second micro-lenses 136a-d are laterally offset or shifted as illustrated by the arrows 706, 708. In some embodiments, the second micro-lenses 136a-d comprise first local shift components (as illustrated by arrows 706) away from a first line intersecting a center of the second image sensor element 106b and second shift components (as illustrated by arrows 708) towards a second line intersecting the center of the second image sensor element 106b.

The third micro-lenses 138a-d are laterally offset or shifted as illustrated by the arrows 710, 712. In various embodiments, the third micro-lenses 138a-d comprise first local shift components (as illustrated by arrows 710) towards a first line intersecting a center of the third image sensor element 106c and second shift components (as illustrated by arrows 712) away from a second line intersecting the center of the third image sensor element 106c. The fourth micro-lenses 140a-d are laterally offset or shifted as illustrated by the arrows 714, 716. In some embodiments, the fourth micro-lenses 140a-d comprise first local shift components (as illustrated by arrows 714) away from a first line intersecting a center of the fourth image sensor element 106d and second shift components (as illustrated by arrows 716) away from a second line intersecting the center of the fourth image sensor element 106d.

Figure 8A:
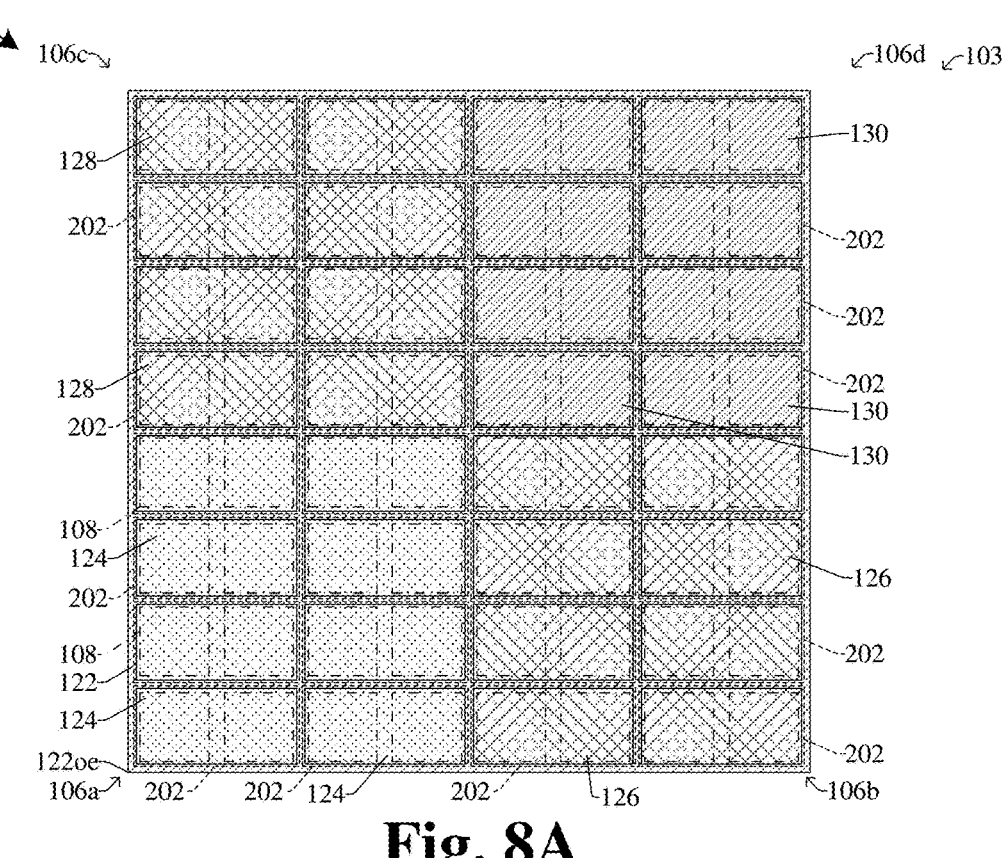
Figure 8B:
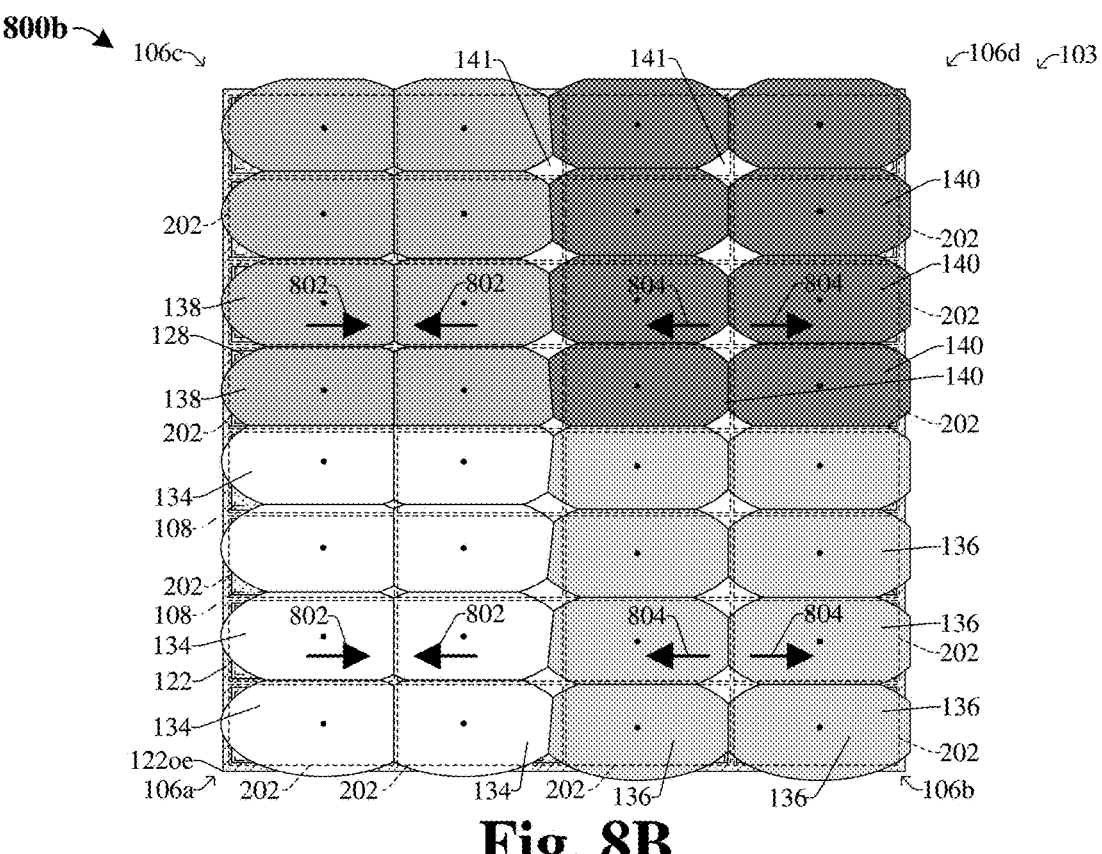
Figure 8C:
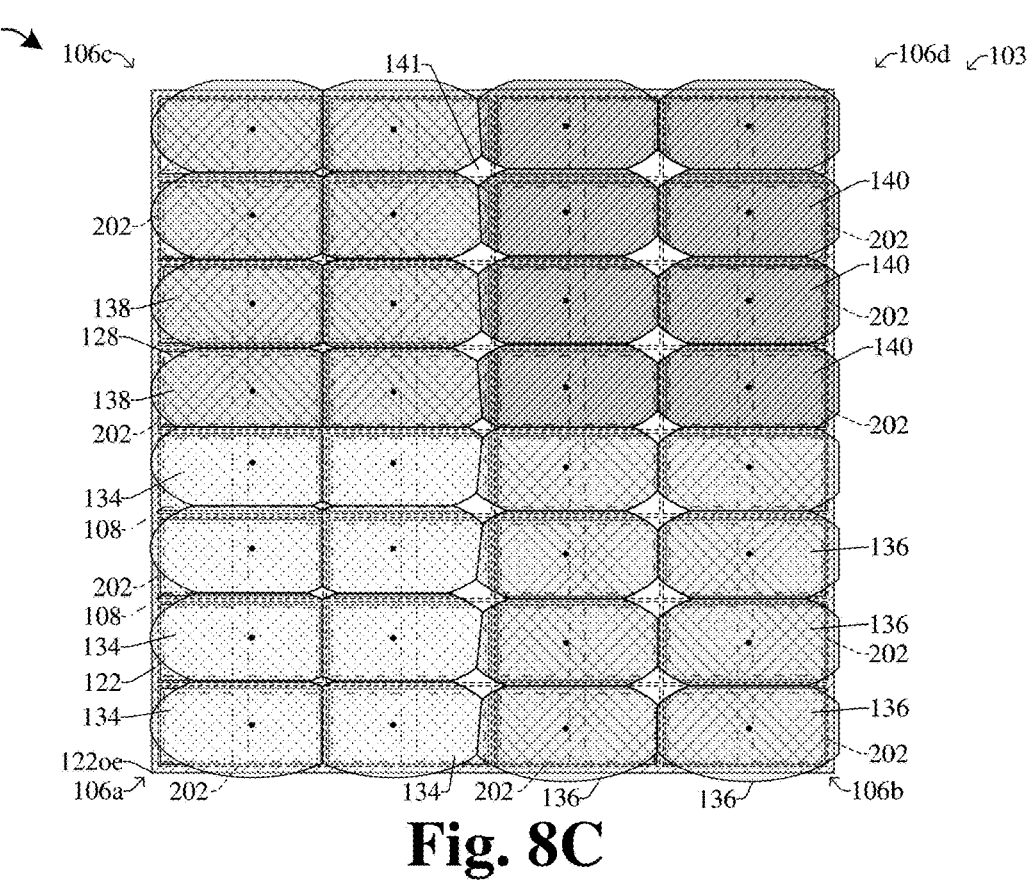

FIGS. 8A-8C illustrate various top views 800a-800c of some embodiments of an imaging device corresponding to some alternative embodiments of the imaging device of FIGS. 2A-2C, where each image sensor element 106a-d comprises a plurality of pixel units 202 that each comprise two photodetectors 108. FIG. 8A illustrates the top view 800a of some embodiments of the imaging device taken along a top surface of the plurality of light filters 124-130, where a light filter overlies each pixel unit 202. FIGS. 8A and 8B illustrate the top views 800a and 800b of some embodiments of the imaging device taken along a top surface of the micro-lens array, where various structures (e.g., the micro-lenses, portions of the upper dielectric layer, etc.) are at least partially transparent in the top view 800c of FIG. 8C for ease of illustration.

In some embodiments, the micro-lens array is laterally offset or shifted from the outer edge 122oe of the grid structure 122 in a direction towards a center of the array of image sensor elements. The micro-lens array comprises the plurality of first, second, third, and fourth micro-lenses 134, 136, 138, 140 that are lateral offset or shifted from centers of corresponding pixel unit 202 of the image sensor elements 106a-d. In some embodiments, the first and third micro-lenses 134, 138 are laterally offset or shifted inwards as illustrated by arrows 802. In some embodiments, the first and third micro-lenses 134, 138 comprise first local shift components (as illustrated by arrows 802) towards a first line intersecting centers of the first and third image sensor elements 106a, 106c. In various embodiments, the second and fourth micro-lenses 136, 140 are laterally offset or shifted outwards as illustrated by the arrows 804. In some embodiments, the second and fourth micro-lenses 136, 140 comprise first local shift components (as illustrated by arrows 804) away from a second line intersecting centers of the second and fourth image sensor elements 106*b*, 106*d*.

Figure 9A:
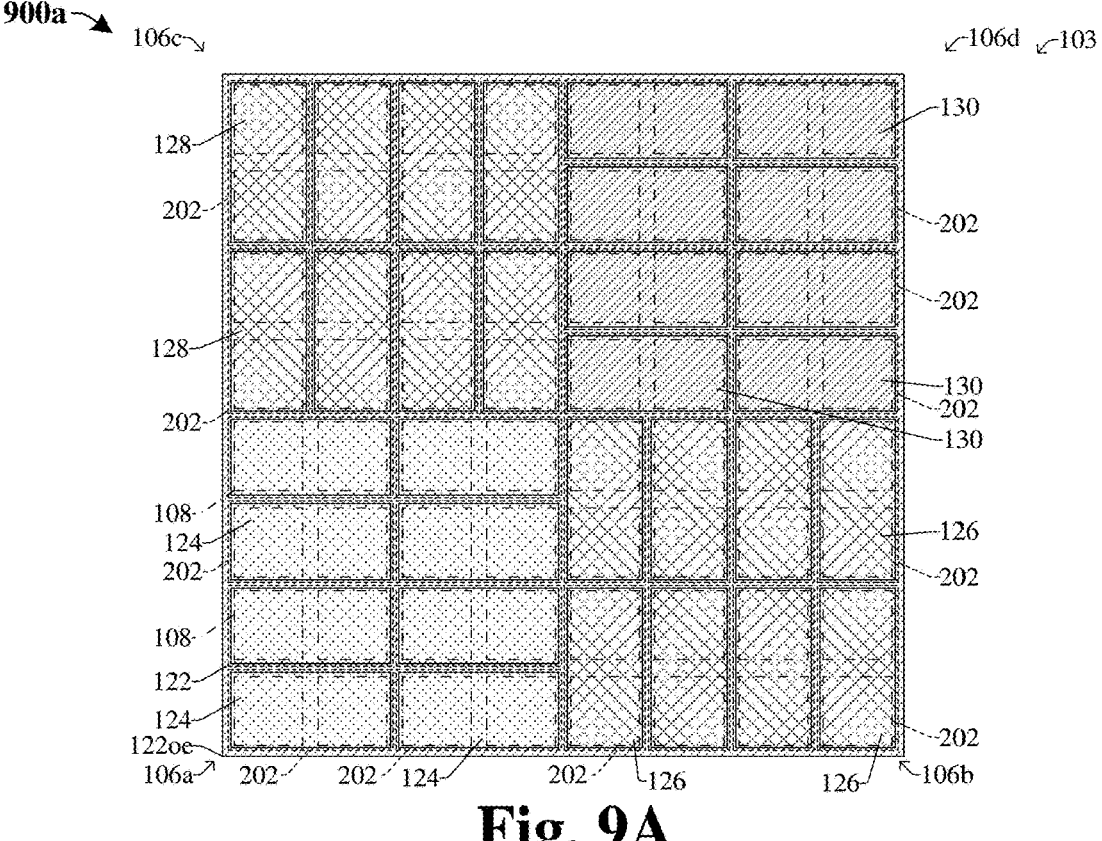
Figure 9B:
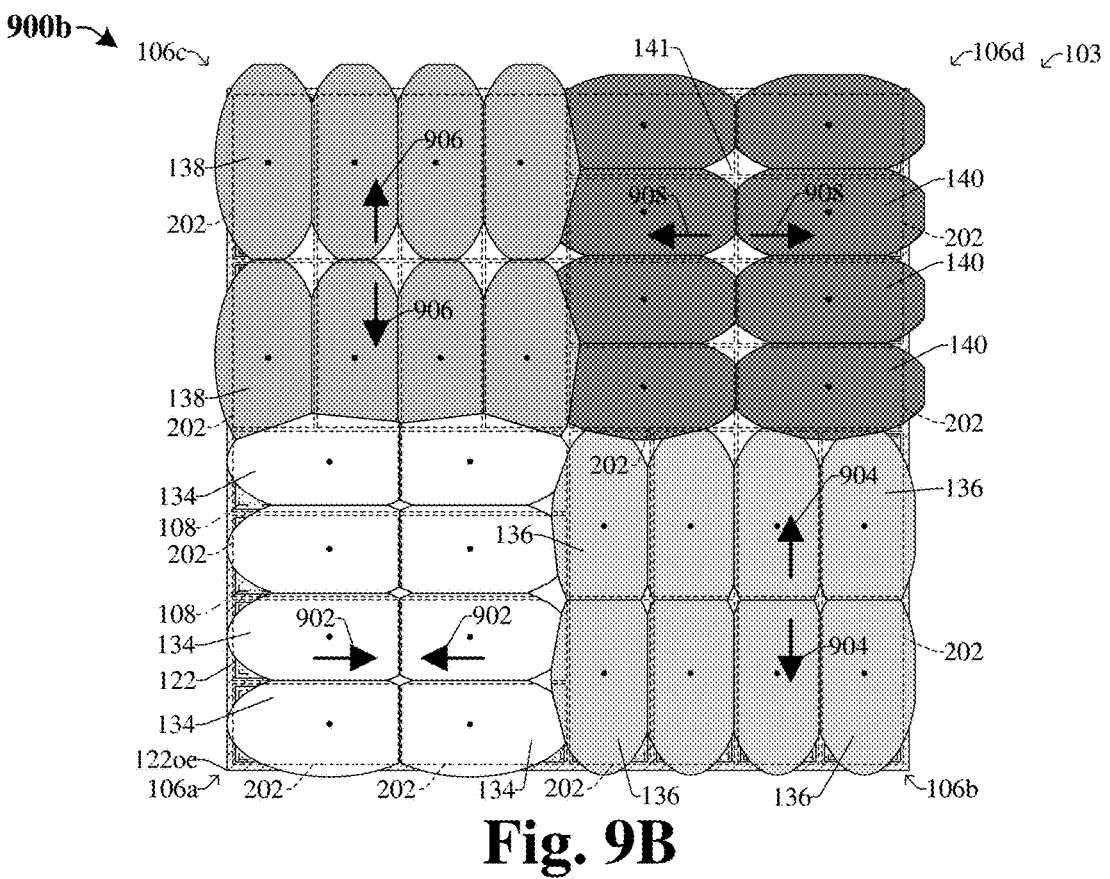
Figure 9C:
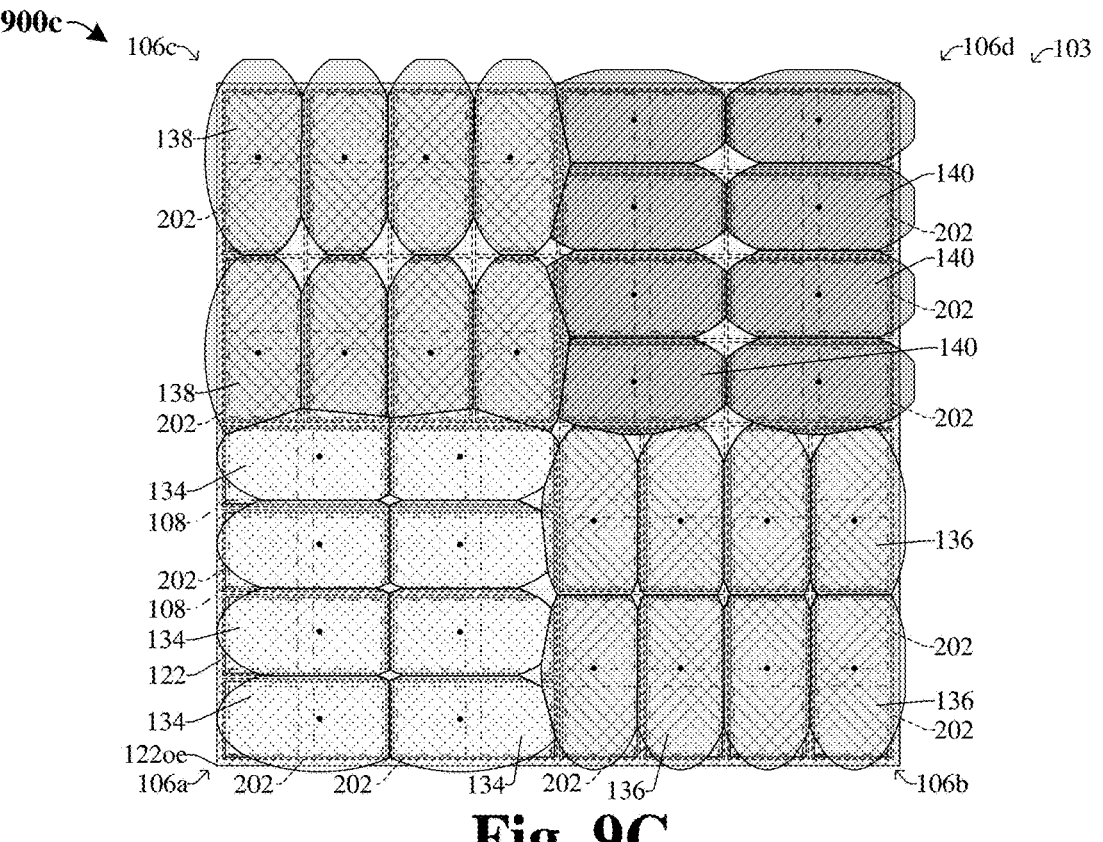

FIGS. 9A-9C illustrate various top views 900*a*-900*c* of some embodiments of an imaging device corresponding to some alternative embodiments of the imaging device of FIGS. 8A-8C, where the orientations of the plurality of pixel units 202 of the image sensor elements 106*a-d* may be different from one another. FIG. 9A illustrates the top view 900*a* of some embodiments of the imaging device taken along a top surface of the plurality of light filters 124-130. FIGS. 9A and 9B illustrate the top views 900*a* and 900*b* of some embodiments of the imaging device taken along a top surface of the micro-lens array, where various structures (e.g., the micro-lenses, portions of the upper dielectric layer, etc.) are at least partially transparent in the top view 900*c* of FIG. 9C for ease of illustration.

In some embodiments, the micro-lens array is laterally offset or shifted from the outer edge 122*oe* of the grid structure 122 in a direction towards a center of the array of image sensor elements. The first micro-lenses 134 are laterally offset or shifted as illustrated by the arrows 902. In some embodiments, the first micro-lenses 134 comprise first local shift components (as illustrated by arrows 902) towards a first line intersecting a center of the first image sensor element 106*a*. The second micro-lenses 136 are laterally offset or shifted as illustrated by the arrows 904. In some embodiments, the second micro-lenses 136 comprise first local shift components (as illustrated by arrows 904) away from a second line intersecting a center of the second image sensor element 106*b*. The third micro-lenses 138 are laterally offset or shifted as illustrated by the arrows 906. In some embodiments, the third micro-lenses 138 comprise first local shift components (as illustrated by arrows 906) away from a third line intersecting a center of the third image sensor element 106*c*. The fourth micro-lenses 140 are laterally offset or shifted as illustrated by the arrows 908. In some embodiments, the fourth micro-lenses 134 comprise first local shift components (as illustrated by arrows 908) away from a fourth line intersecting a center of the fourth image sensor element 106*d*.

Figure 10A:
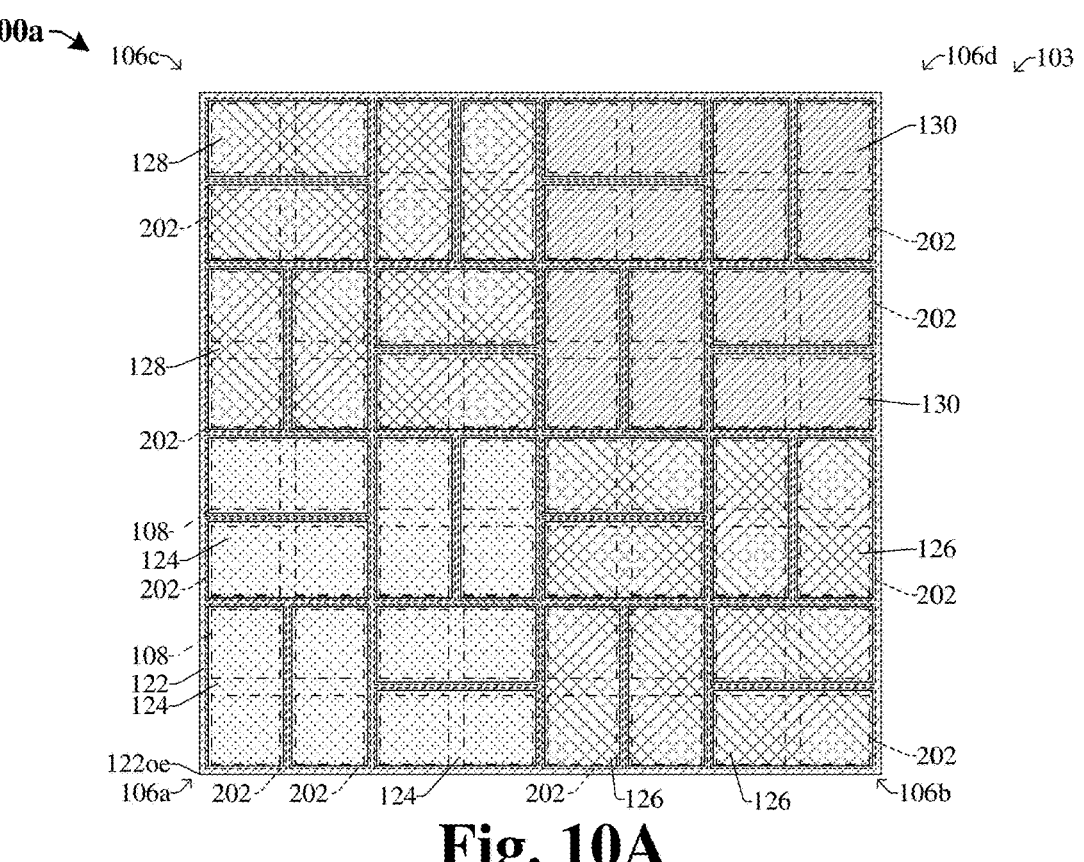
Figure 10B:
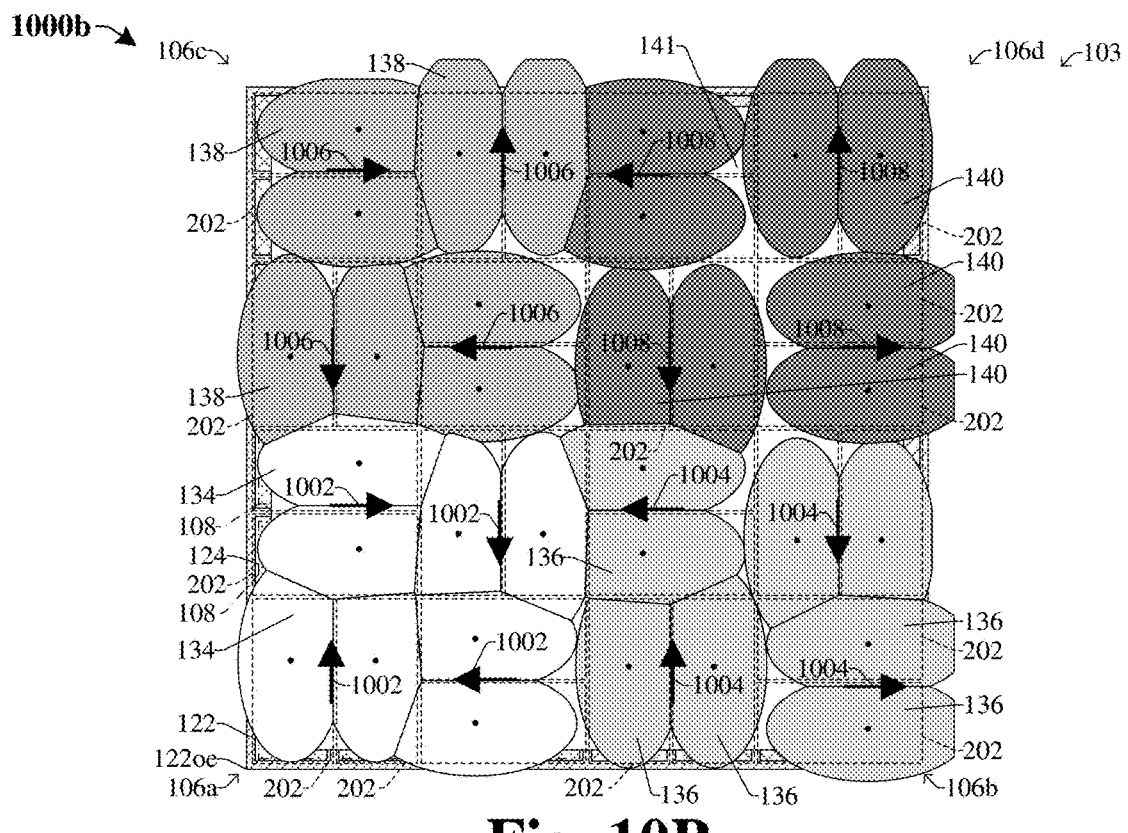
Figure 10C:
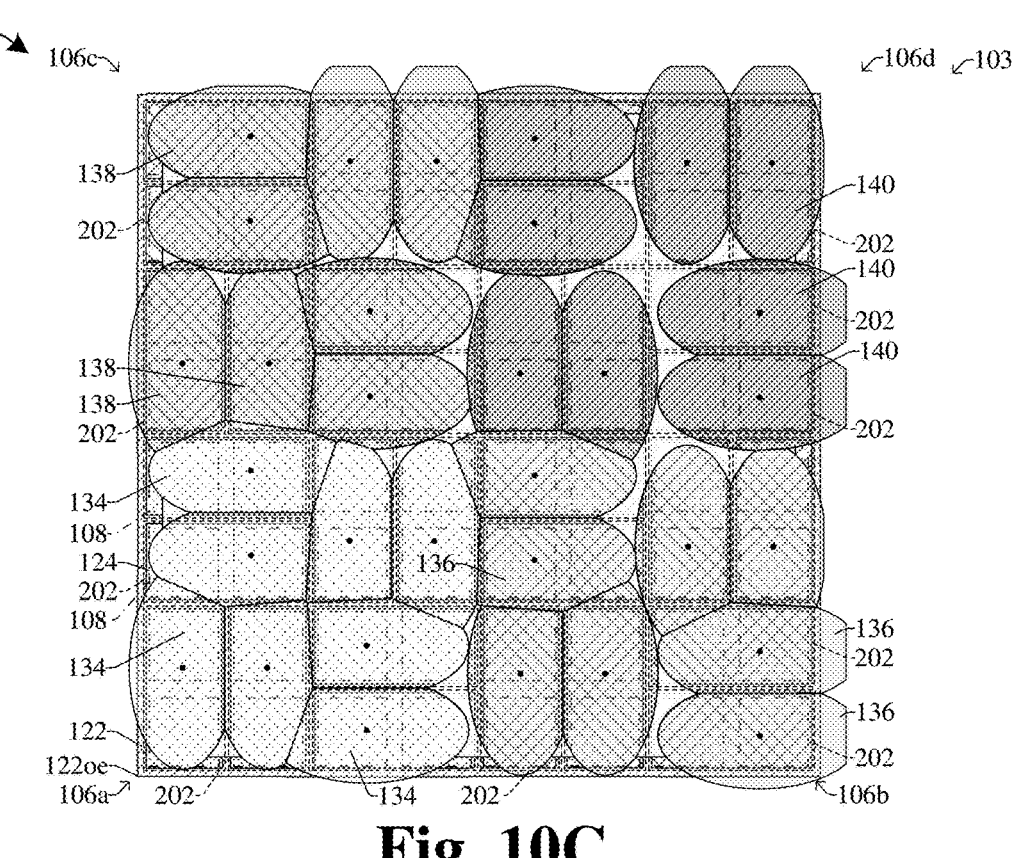

FIGS. 10A-10C illustrate various top views 900*a*-900*c* of some embodiments of an imaging device corresponding to some alternative embodiments of the imaging device of FIGS. 9A-9C, where the orientations of the plurality of pixel units 202 of the image sensor elements 106*a-d* may be different from one another. FIG. 10A illustrates the top view 1000*a* of some embodiments of the imaging device taken along a top surface of the plurality of light filters 124-130. FIGS. 10B and 10C illustrate the top views 1000*b* and 1000*c* of some embodiments of the imaging device taken along a top surface of the micro-lens array, where various structures (e.g., the micro-lenses, portions of the upper dielectric layer, etc.) are at least partially transparent in the top view 1000*c* of FIG. 10C for ease of illustration.

In some embodiments, the micro-lens array is laterally offset or shifted from the outer edge 122*oe* of the grid structure 122 in a direction towards a center of the array of image sensor elements. In some embodiments, the first micro-lenses 134 are laterally offset or shifted from corresponding pixel units 202 of the first image sensor element 106*a* as illustrated by arrows 1002, where pairs of adjacent first micro-lenses 134 are laterally offset or shifted in different directions. In some embodiments, the second micro-lenses 136 are laterally offset or shifted from corresponding pixel units 202 of the second image sensor element 106*b* as illustrated by arrows 1004, where pairs of adjacent second micro-lenses 136 are laterally offset or shifted in different directions. In some embodiments, the third micro-lenses 138 are laterally offset or shifted from corresponding pixel units 202 of the third image sensor element 106*c* as illustrated by arrows 1006, where pairs of adjacent third micro-lenses 138 are laterally offset or shifted in different directions. In some embodiments, the fourth micro-lenses 140 are laterally offset or shifted from corresponding pixel units 202 of the fourth image sensor element 106*d* as illustrated by arrows 1008, where pairs of adjacent micro-lenses 140 are laterally offset or shifted in different directions.

Figure 11A:
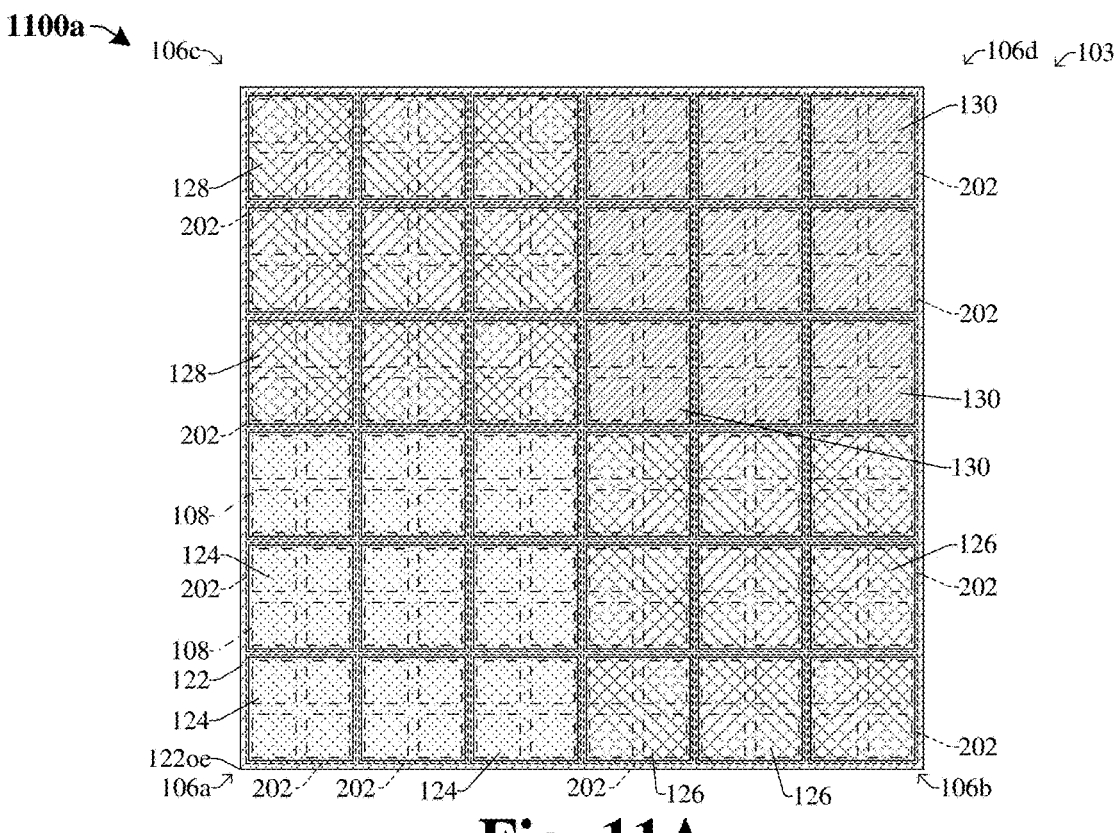
Figure 11B:
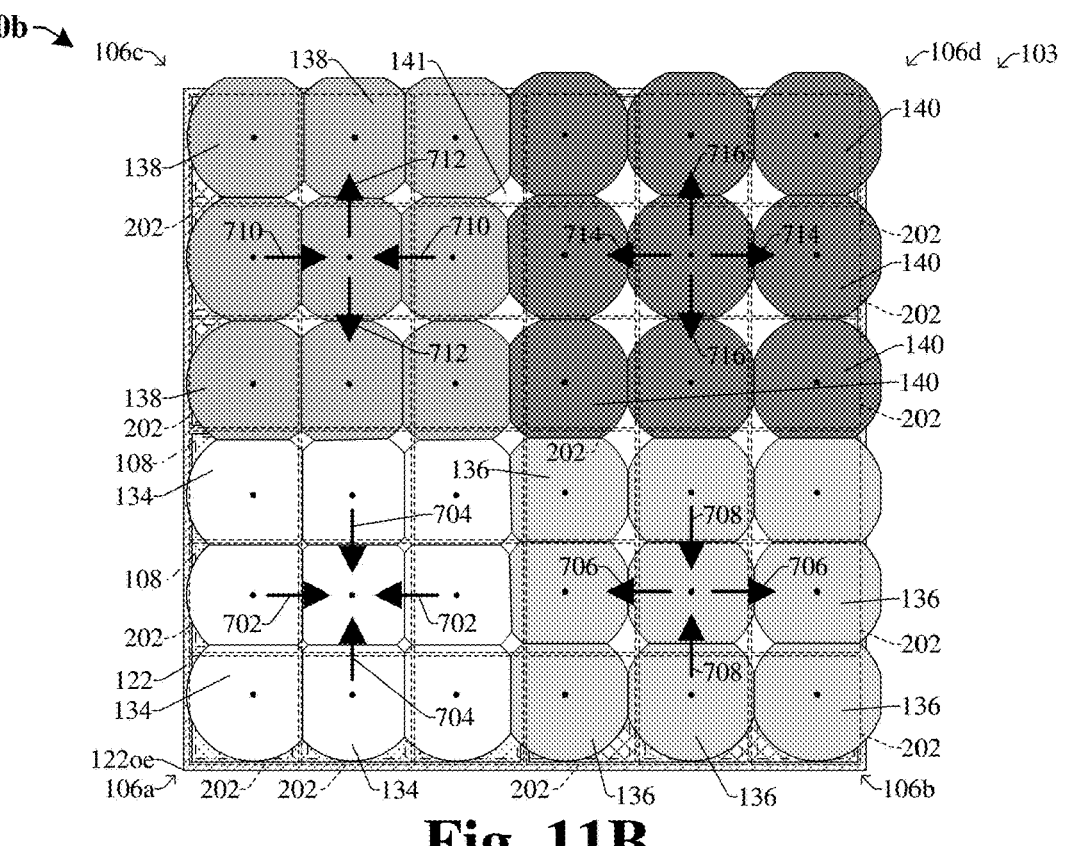
Figure 11C:
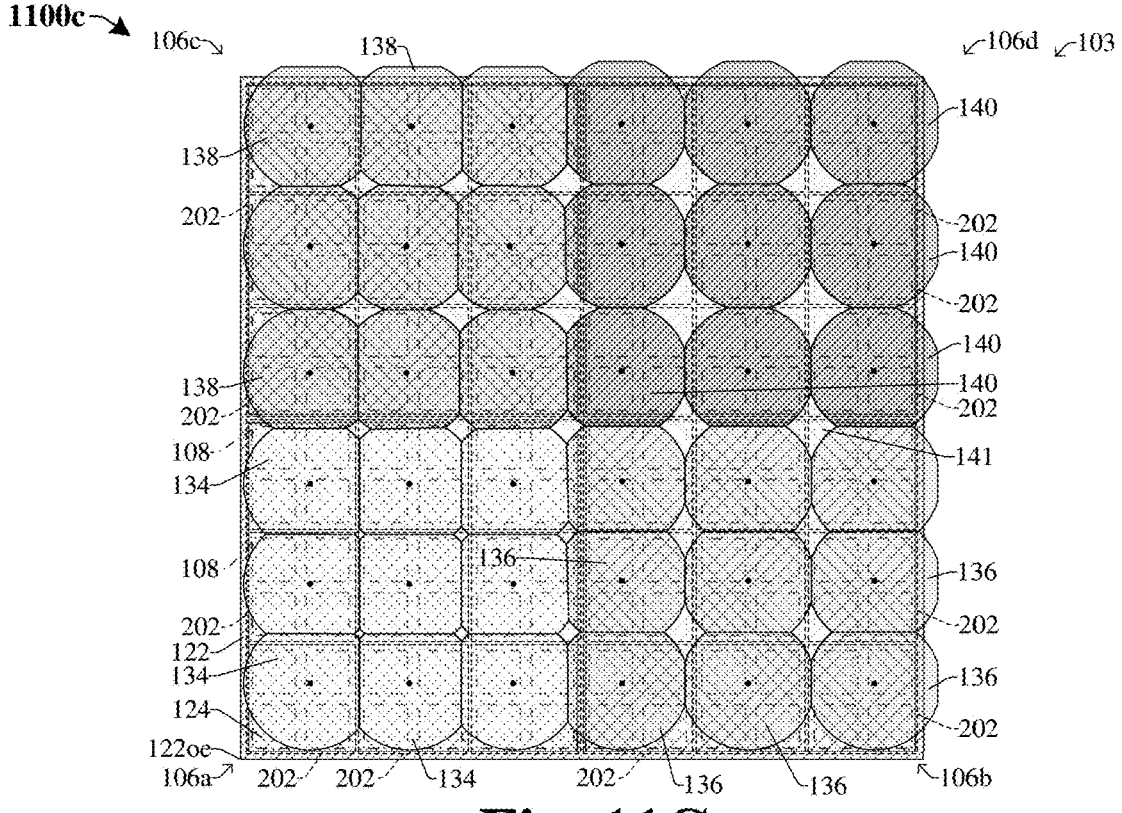

FIGS. 11A-11C illustrate top views 1100*a*-1100*c* of some embodiments of an imaging device corresponding to some alternative embodiments of the imaging device of FIGS. 7A-7B, where the image sensor elements 106*a-d* each comprises nine pixel units 202. It will be appreciated that while the FIGS. 11A-11C illustrates the image sensor elements 106*a-d* comprising nine pixel units 202, this is merely a non-limiting example and the image sensor elements 106*a-d* comprising other numbers of pixel units 202 is within the scope of the present disclosure. FIG. 11A illustrates the top view 1100*a* of some embodiments of the imaging device taken along a top surface of the plurality of light filters 124-130. FIGS. 11B and 11C illustrate the top views 1100*b* and 1100*c* of some embodiments of the imaging device taken along a top surface of the micro-lens array, where various structures (e.g., the micro-lenses, portions of the upper dielectric layer, etc.) are at least partially transparent in the top view 1100*c* of FIG. 11C for ease of illustration.

Figure 12A:
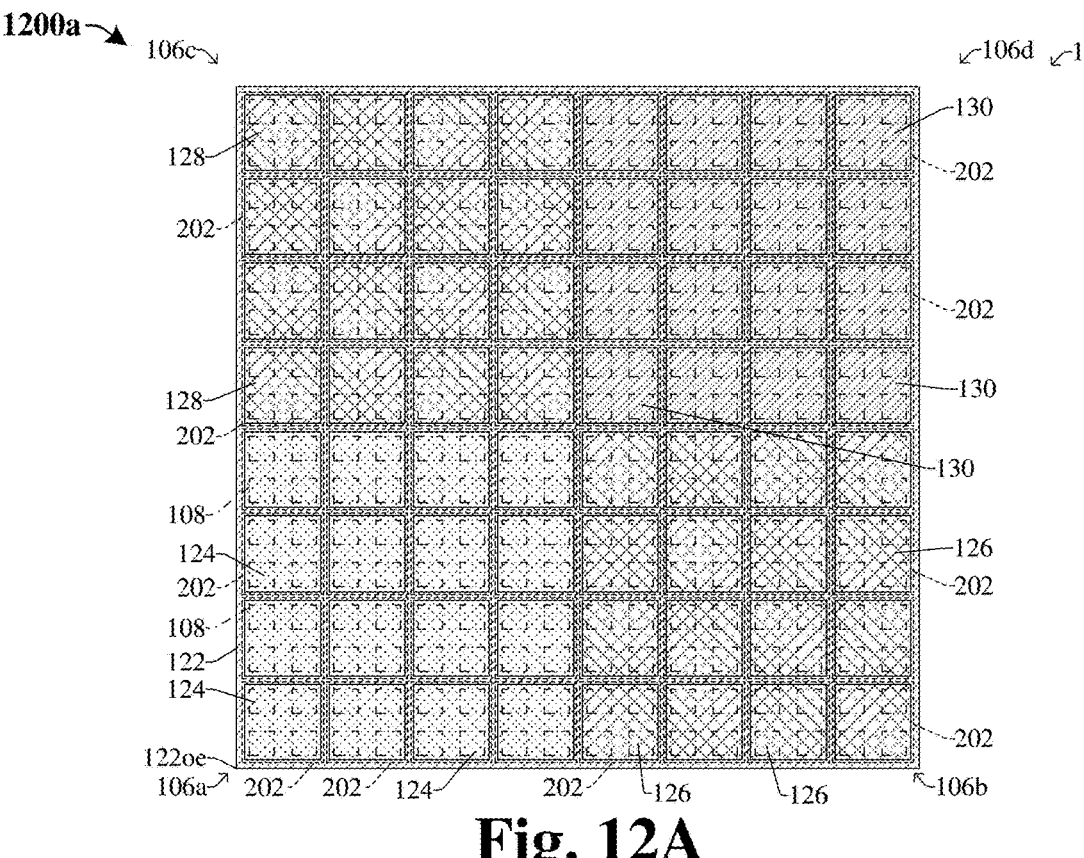
Figure 12B:
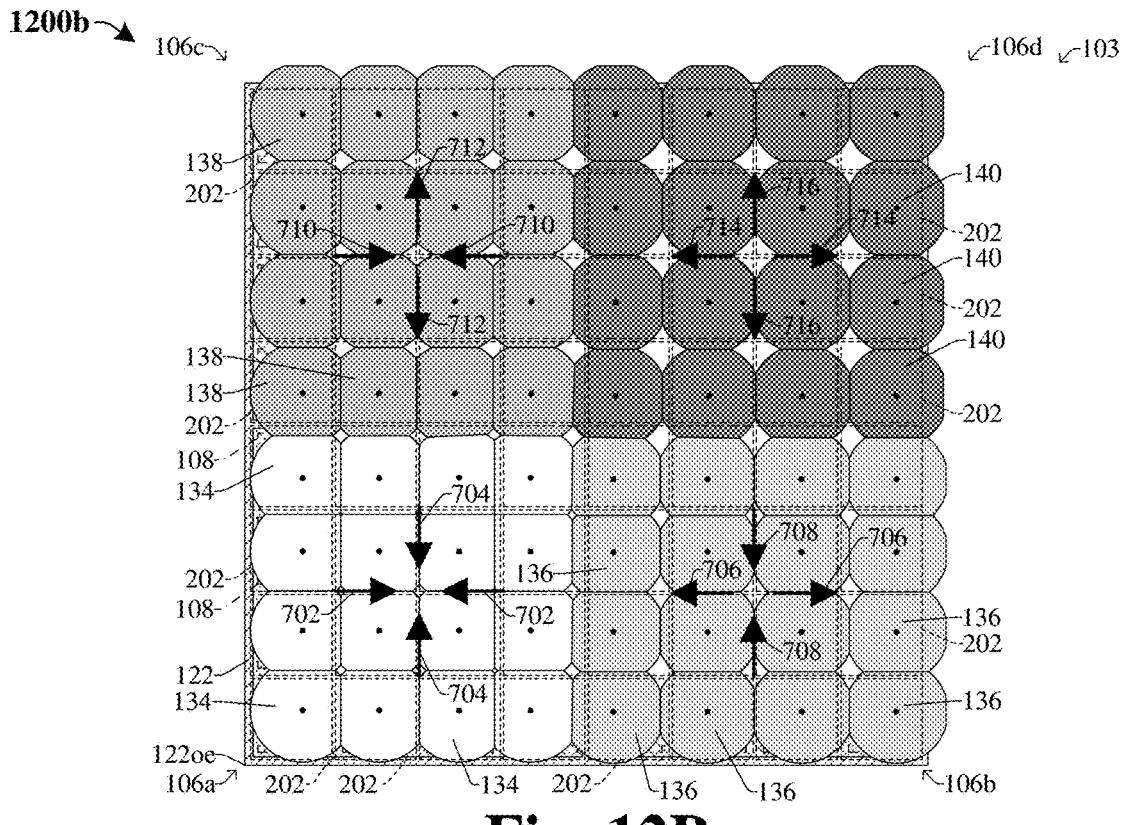
Figures 12C, 13A:
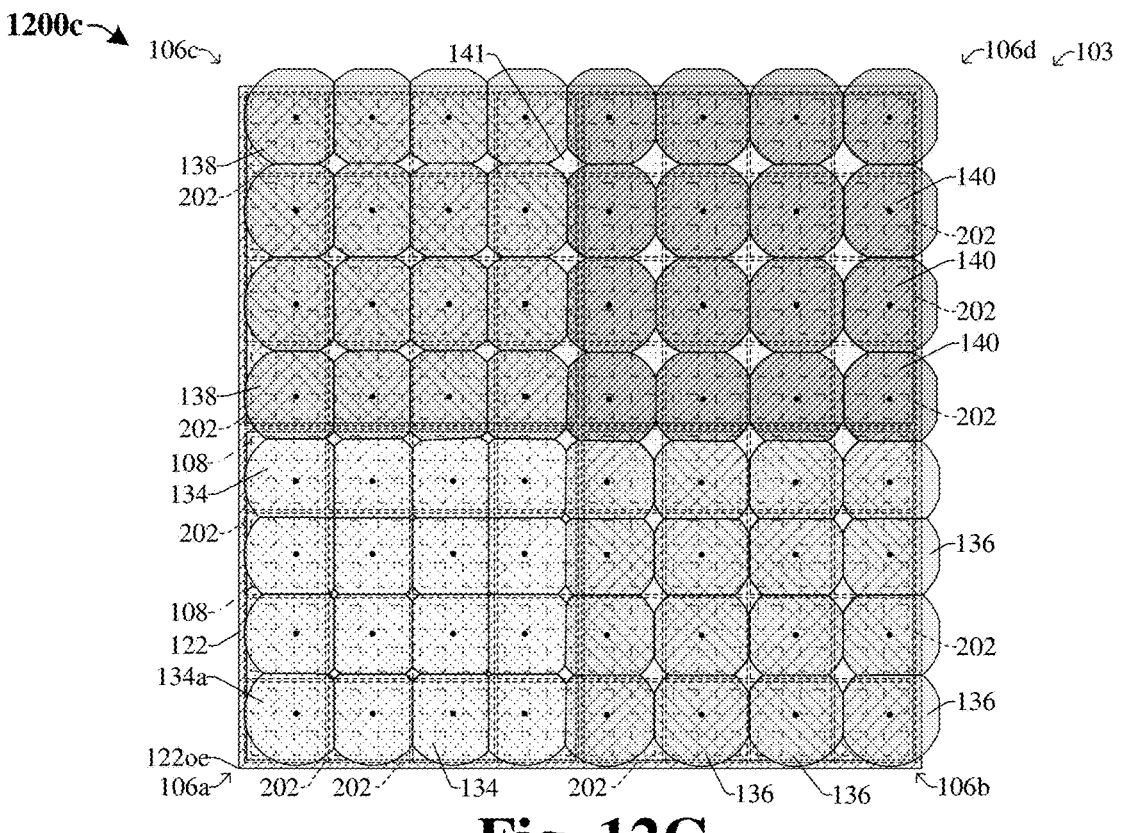

FIGS. 12A-12C illustrate top views 1200*a*-1200*c* of some embodiments of an imaging device corresponding to some alternative embodiments of the imaging device of FIGS. 7A-7B, where the image sensor elements 106*a-d* each comprises sixteen pixel units 202. It will be appreciated that while the FIGS. 12A-12C illustrates the image sensor elements 106*a-d* comprising sixteen pixel units 202, this is merely a non-limiting example and the image sensor elements 106*a-d* comprising other numbers of pixel units 202 is within the scope of the present disclosure. FIG. 12A illustrates the top view 1200*a* of some embodiments of the imaging device taken along a top surface of the plurality of light filters 124-130. FIGS. 12B and 12C illustrate the top views 1200*b* and 1200*c* of some embodiments of the imaging device taken along a top surface of the micro-lens array, where various structures (e.g., the micro-lenses, portions of the upper dielectric layer, etc.) are at least partially transparent in the top view 1200*c* of FIG. 12C for ease of illustration.

Figures 13B, 13C:
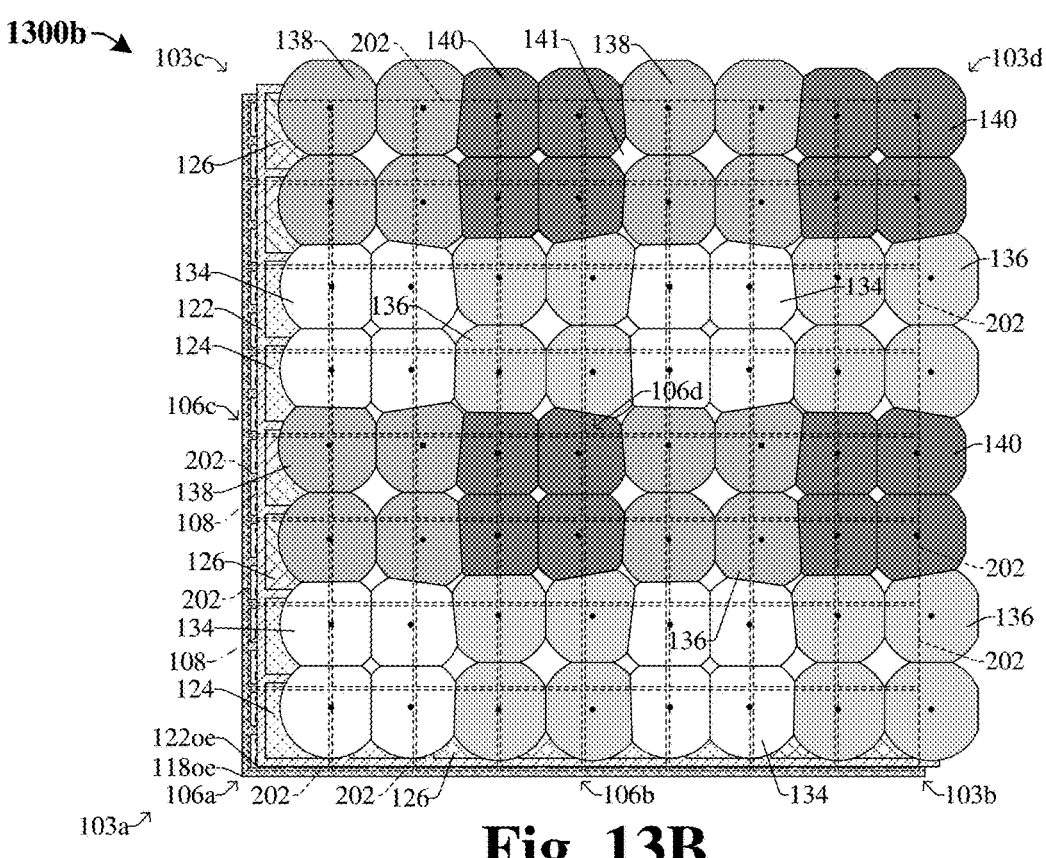

FIGS. 13A-13C illustrate top views 1300*a*-1300*c* of some embodiments of an imaging device corresponding to some alternative embodiments of the imaging device of FIGS. 3A-3B, where the imaging device comprises a plurality of image sensors 103*a-d* that are part of an array of image sensors. In some embodiments, each of the image sensors 103*a-d* are configured as the image sensor 103 of FIG. 3A-3B, such that the plurality of first, second, micro-lenses 134-140 over each image sensor 103*a-d* are laterally offset or shifted in a similar manner as illustrated and/or described in FIGS. 3A-3B. Further, the outer edge 122*oe* of the grid structure 122 is laterally offset or shifted from the outer edge 118*oe* of the isolation structure 118 in a direction towards a center of the array of image sensors. The plurality of image sensors 103*a-d* comprise a first image sensor 103*a*, a second image sensor 103*b*, a third image sensor 103*c*, and a fourth image senor 103*d*. FIG. 13A illustrates the top view 1300*a* of some embodiments of the imaging device taken along a top surface of the plurality of light filters 124-130, where, for ease of illustration, the pixel units 202 and the photodetectors 108 for the first image sensor 103*a* are labeled and are not labeled for the second, third, and fourth image sensor elements 103*b-d*. FIGS. 13B and 13C illustrate the top views 1300*b* and 1300*c* of some embodiments of the imaging device taken along a top surface of the micro-lens array, where various structures (e.g., the micro-lenses, portions of the upper dielectric layer, etc.) are at least partially transparent in the top view 1300*c* of FIG. 13C for ease of illustration.

FIGS. 14-21B illustrate various views 1400-2100*b* of some embodiments of a method of forming an imaging device comprising a plurality of micro-lenses having different lateral offsets or shifts with corresponding pixel units. Although the various views 1400-2000*b* shown in FIGS. 14-20B are described with reference to a method, it will be appreciated that the structures shown in FIGS. 14-20B are not limited to the method but rather may stand alone separate of the method. Further, although FIGS. 14-20B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

As illustrated in cross-sectional view 1400 of FIG. 14, a semiconductor substrate 102 is provided and a plurality of image sensor elements 106*a-b* is formed within the semiconductor substrate 102, thereby defining an image sensor 103. The semiconductor substrate 102 may, for example, be or comprise silicon, monocrystalline silicon, bulk silicon, epitaxial silicon, germanium, silicon germanium, another semiconductor material, or any combination of the foregoing and may have a first doping type (e.g., p-type). In various embodiments, each image sensor element 106*a-b* comprises a plurality of pixel units 202*a-d* (e.g., as illustrated in FIGS. 5A-5E), where each pixel unit 202*a-d* comprises a plurality of photodetectors 108 and the image sensor 103 is part of an array of image sensors. In some embodiments, a process for forming the image sensor elements 106*a-b* comprises selectively doping the semiconductor substrate 102 to implant dopants within the semiconductor substrate 102 and form the plurality of photodetectors 108. The plurality of photodetectors 108 have a second doping type (e.g., n-type) opposite the first doping type (e.g., p-type).

As illustrated in cross-sectional view 1500 of FIG. 15, a plurality of pixel devices 110 is formed on a front-side surface 102*f* of the semiconductor substrate 102. In some embodiments, a process for forming the plurality of pixel devices 110 comprises: depositing (e.g., by physical vapor deposition (PVD), chemical vapor deposition (CVD), atomic layer deposition (ALD), etc.) a gate dielectric over the semiconductor substrate 102; depositing (e.g., by PVD, CVD, sputtering, electroplating, etc.) a gate electrode on the gate dielectric; performing a pattering process on the gate electrode and the gate dielectric; and forming a sidewall spacer around sidewalls of the gate electrode and the gate dielectric.

As illustrated in cross-sectional view 1600 of FIG. 16, an interconnect structure 104 is formed on the front-side surface 102*f* of the semiconductor substrate 102. The interconnect structure 104 comprises a plurality of conductive vias 112, a plurality of conductive wires 114, and an interconnect dielectric structure 116. The interconnect dielectric structure 116 may be formed by one or more deposition process such as a PVD process, a CVD process, an ALD process, another suitable growth or deposition process, or any combination of the foregoing. In some embodiments, the plurality of conductive vias 112 and the plurality of conductive wires 114 may be formed by one or more deposition process(es), one or more patterning process(es), one or more planarization process(es), some other suitable fabrication process(es), or any combination of the foregoing. For instance, the plurality of conductive vias and wires 112, 114 may be formed by a single damascene process, a dual damascene process, some other suitable process, or any combination of the foregoing.

Figure 17:
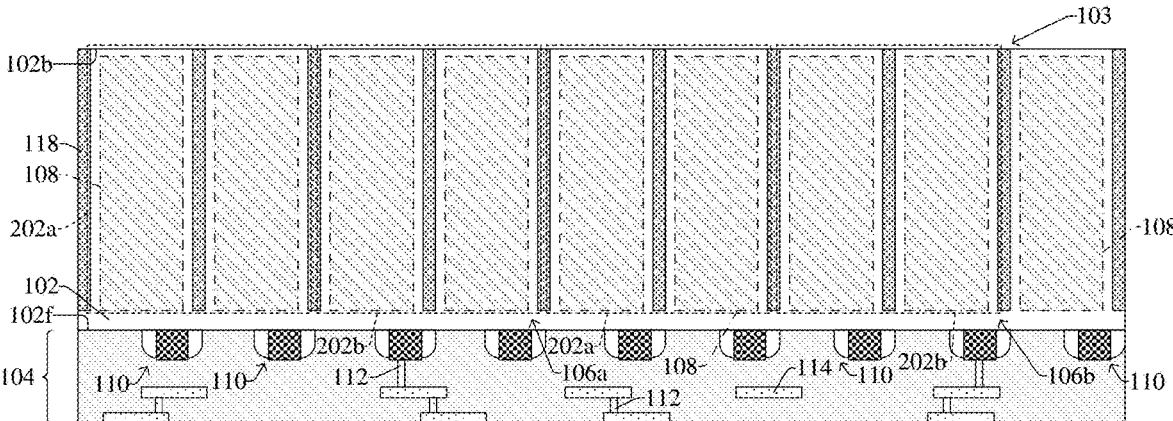

As illustrated in cross-sectional view 1700 of FIG. 17, an isolation structure 118 is formed within the semiconductor substrate 102. In some embodiments, a process for forming the isolation structure 118 comprises: selectively etching a back-side surface 102*b* of the semiconductor substrate 102 to form a trench between adjacent photodetectors 108; depositing (e.g., by CVD, PVD, ALD, etc.) an isolation structure material (e.g., comprising a dielectric material and/or a metal material) within the trench; and performing a planarization process (e.g., a chemical mechanical planarization (CMP) process, an etching process, etc.) on the isolation structure material.

Figure 18:
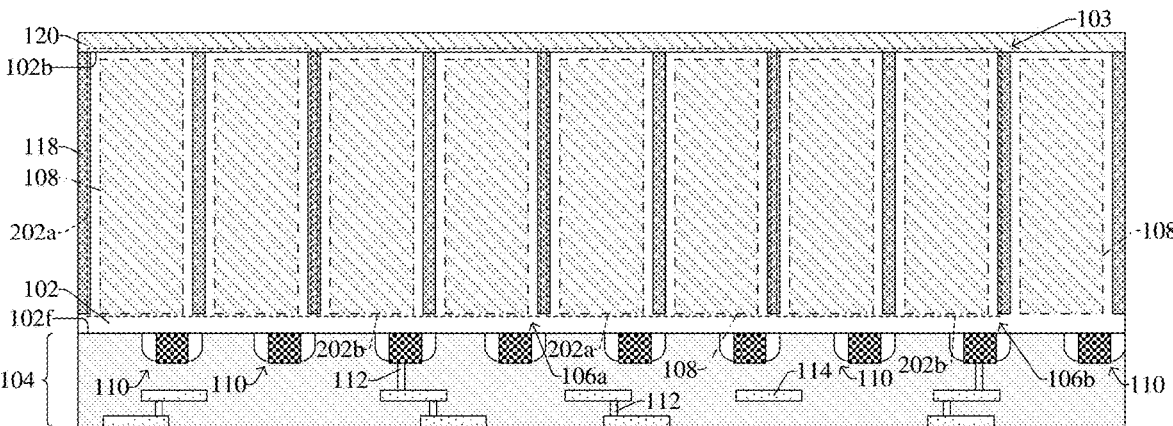

As illustrated in cross-sectional view 1800 of FIG. 18, a passivation layer 120 is formed on the back-side surface 102*b* of the semiconductor substrate 102. In some embodiments, the passivation layer 120 may be formed on the back-side surface 102*b* by a deposition process such as a PVD process, a CVD process, an ALD process, or another suitable growth or deposition process. The passivation layer 120 may, for example, be or comprise an oxide, silicon dioxide, a nitride (e.g., silicon nitride), a metal oxide (e.g., tantalum oxide, aluminum oxide, etc.), some other suitable material, or any combination of the foregoing.

Figure 19A:
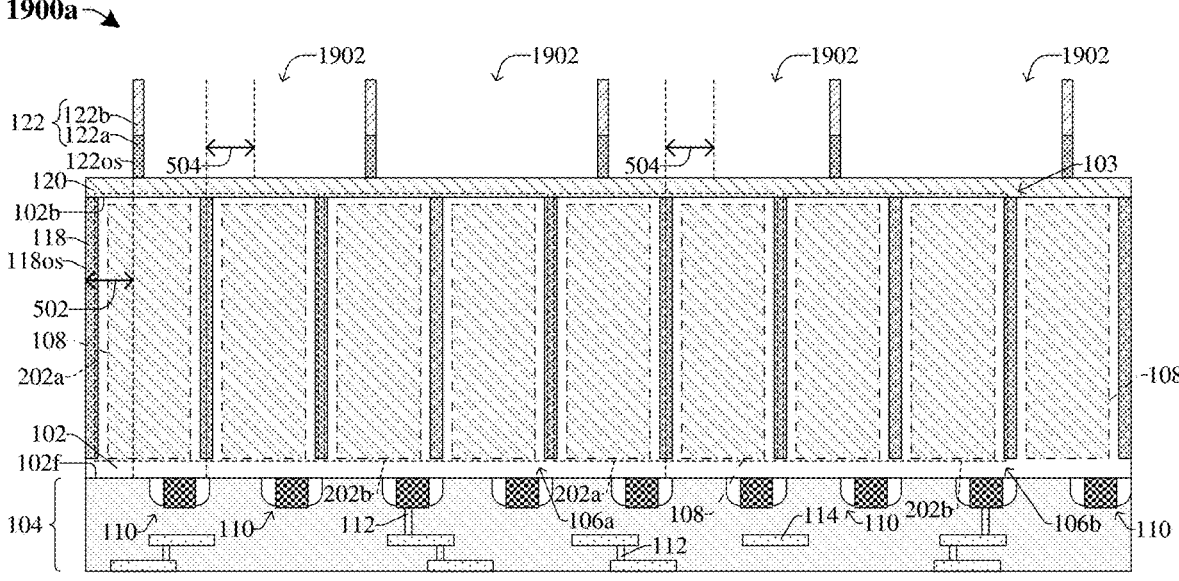
Figure 19B:
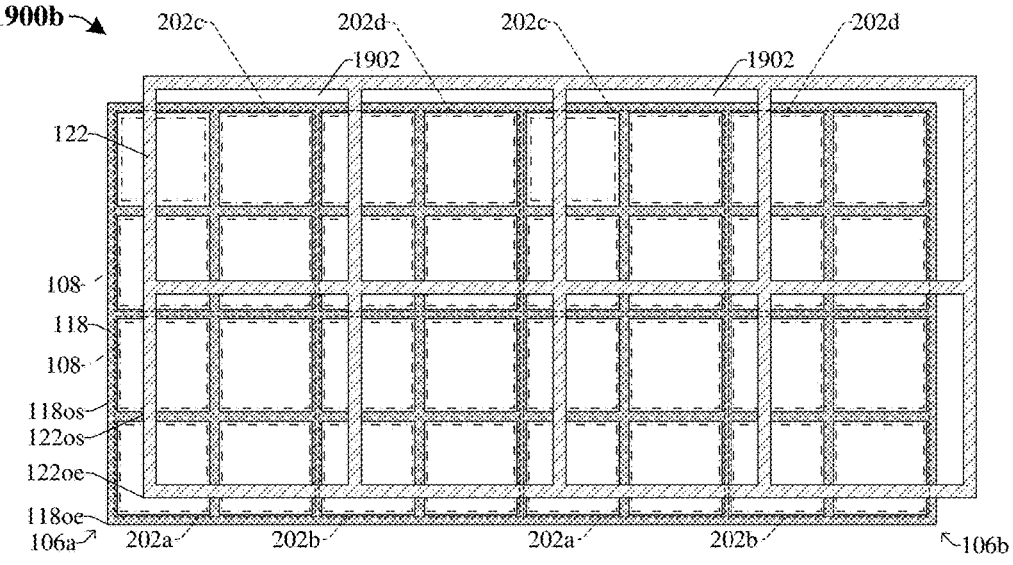

As illustrated in cross-sectional view 1900*a* and top view 1900*b* of FIGS. 19A and 19B, a grid structure 122 is formed over the back-side surface 102*b* of the semiconductor substrate 102. In various embodiments, the grid structure 122 comprises a first grid layer 122*a* vertically stacked with a second grid layer 122*b*. The grid structure 122 comprises a plurality of sidewalls defining a plurality of grid openings 1902 that overlie a corresponding pixel unit 202*a-d* in the image sensor elements 106*a-b*. In some embodiments, the grid structure 122 is formed such that an outer sidewall 122*os* of the grid structure 122 is laterally offset or shifted from an outer sidewall 118*os* of the isolation structure 118 by a grid shift amount 502. Further, the grid openings 1902 are laterally offset or shifted from a corresponding pixel unit 202*a-d* by grid opening shift amounts 504. In some embodiments, the grid opening shift amounts 504 are relative to centers of the pixel units 202*a-d* and centers of the grid openings 1902, where the grid opening shift amounts 504 may be proportional to the distances of the pixel unit 202*a-d* from a center of the array of image sensor elements. In alternative embodiments, the grid opening shift amounts 504 are relative to the isolation structure 118 and the grid structure 122.

In some embodiments, a process for forming the grid structure 122 comprises: depositing (e.g., by PVD, CVD, ALD, sputtering, electroplating, electroless plating, etc.) the first grid layer 122*a* over the passivation layer; depositing (e.g., by PVD, CVD, ALD, sputtering, electroplating, electroless plating, etc.) the second grid layer 122*b* on the first grid layer 122*a*; selectively etching the first and second grid layers 122*a*, 122*b* to define the plurality of grid openings 1902. In some embodiments, selectively etching the first and second grid layers 122a, 122b may comprise a dry etch, a wet etch, or the like. The first grid layer 122a may, for example, be or comprise a metal material such as aluminum, copper, tungsten, another conductive material, or any combination of the foregoing. The second grid layer 122b may, for example, be or comprise a dielectric material such as silicon dioxide, silicon nitride, a metal oxide, another dielectric material, or any combination of the foregoing. In yet further embodiments, the first grid layer 122a may overlie the second grid layer 122b (not shown).

Figure 20A:
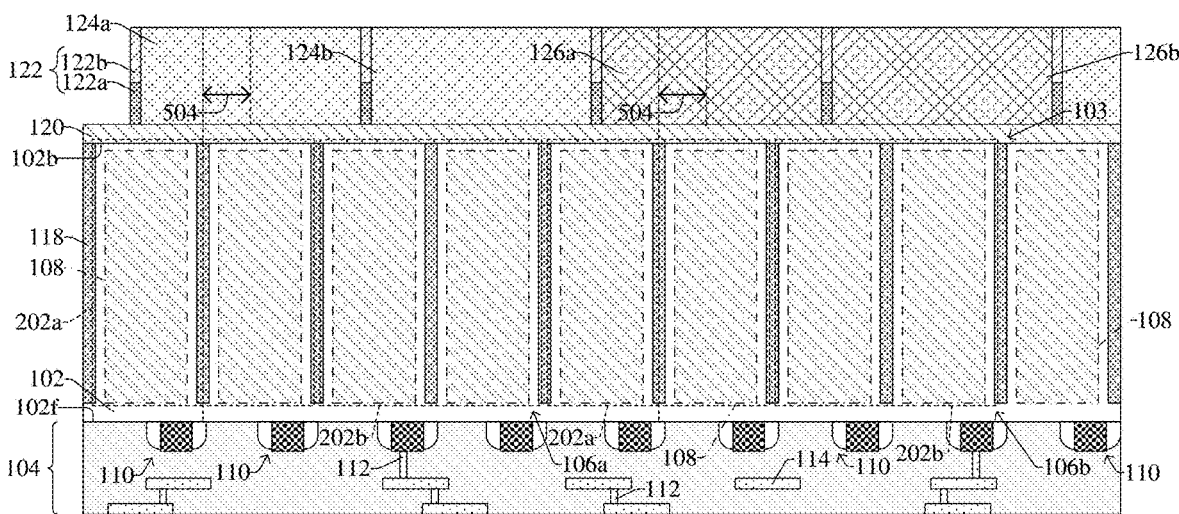
Figure 20B:
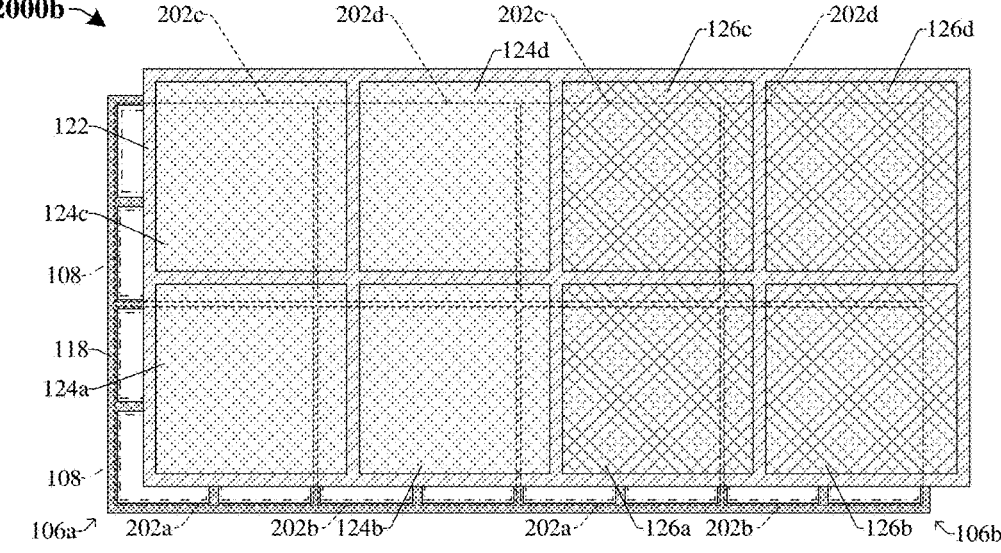

As illustrated in cross-sectional view 2000a and top view 2000b of FIGS. 20A and 20B, a plurality of light filters 124a-d, 126a-d is formed over the semiconductor substrate 102. It will be appreciated that while FIGS. 20A and 20B illustrate the light filters 124a-d, 126a-d being formed over the semiconductor substrate 102, any number of light filters may be formed over the semiconductor substrate 102 (e.g., such as the light filters illustrated and/or described in FIGS. 1A-4B and 6A-13C). The plurality of light filters 124a-d, 126a-d are assigned corresponding colors or wavelengths of light (e.g., according to a Bayer pattern), and formed of materials configured to transmit the assigned color or wavelengths of light to the corresponding image sensor elements 106a-b. In some embodiments, a process for forming the plurality of light filters 124a-d, 126a-d may include, for each of the different color filter assignments, forming a light filter layer within corresponding grid openings (1902 of FIGS. 19A and 19B) and patterning the light filter layer. In various embodiments, a planarization process (e.g., a CMP process) may be performed after patterning each light filter layer, such that top surfaces of the plurality of light filters 124a-d, 126a-d are co-planar with a top surface of the grid structure 122.

Figure 21A:
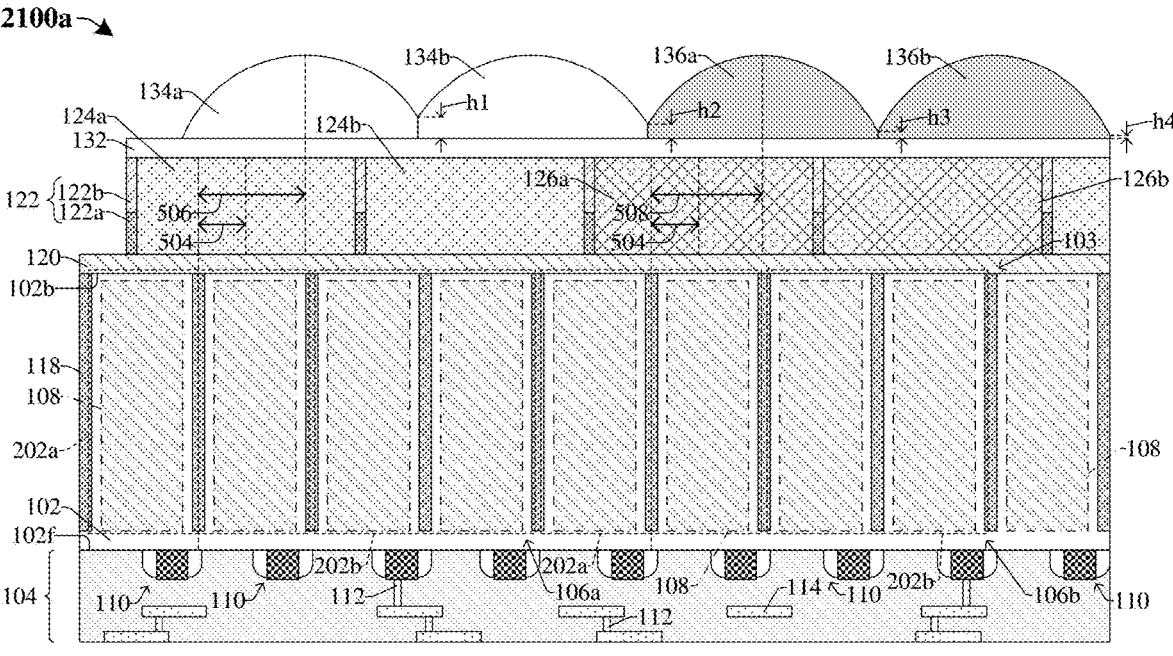
Figure 21B:
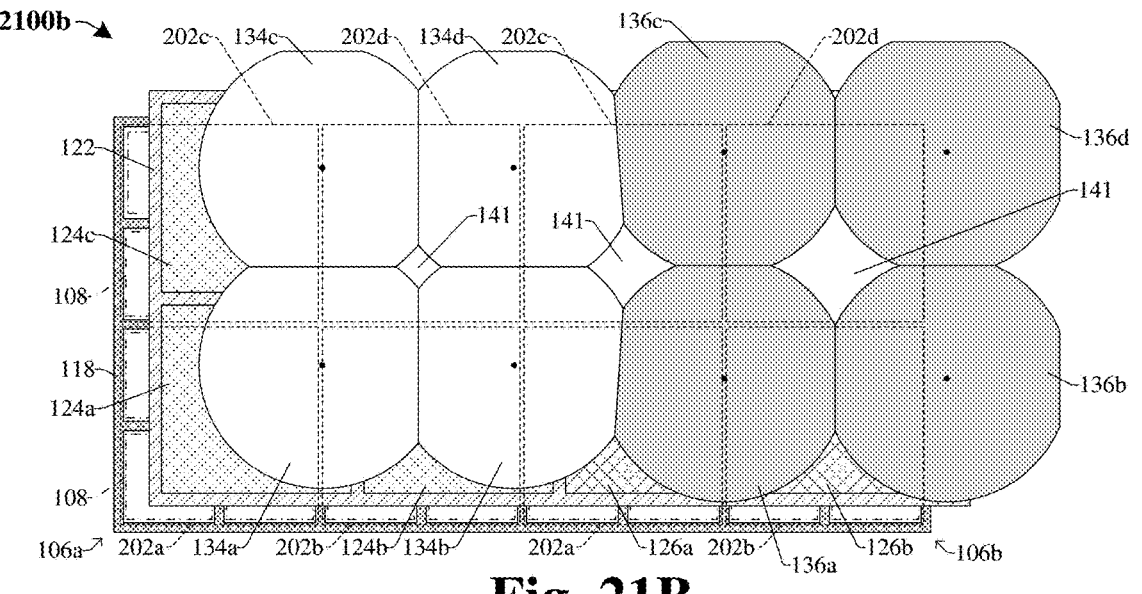

As illustrated in cross-sectional view 2100a and top view 2100b of FIGS. 21A and 21B, an upper dielectric layer 132, a plurality of first micro-lenses 134a-d, and a plurality of second micro-lenses 136a-d are formed over the semiconductor substrate 102. It will be appreciated that while FIGS. 21A and 21B illustrate the first and second micro-lenses 134a-d, 136a-d being formed over the semiconductor substrate 102, any number of micro-lenses may be formed over the semiconductor substrate 102 (e.g., such as the micro-lenses illustrated and/or described in FIGS. 1A-4B and 6A-13C). The first and second micro-lenses 134a-d, 136a-d are formed such that centers of the first micro-lenses 134a-d are laterally offset or shifted from centers of corresponding pixel units 202a-d of the first image sensor elements 106a by first lens shift amounts and centers of the second micro-lenses 136a-d are laterally offset or shifted from centers of corresponding pixel units 202a-d of the second image sensor elements 106b by second lens shift amounts, where the first lens shift amounts are different from the second lens shift amounts. For example, the first micro-lens 134a is laterally offset or shifted from a center of the pixel unit 202a of the first image sensor element 106a by a first lens shift amount 506, and the second micro-lens 136a is laterally offset or shifted from a center of the pixel unit 202a of the second image sensor element 106b by a second lens shift amount 508 different from the first lens shift amount 506.

In some embodiments, a process for forming the first and second micro-lenses 134a-d, 136a-d may include depositing a micro-lens material over the grid structure 122 (e.g., by a spin-on method, CVD, PVD, ALD, etc.); forming a micro-lens template having curved upper surfaces above the micro-lens material; and selectively etching the micro-lens material according to the micro-lens template to form the first and second micro-lenses 134a-d, 136a-d. In such embodiments, the micro-lens template is patterned to comprise the lens shift amounts corresponding to the first and second lens shift amounts of the first and second micro-lenses 134a-d, 136a-d. In various embodiments, the upper dielectric layer 132 may be a lower portion of the micro-lens material that remains after selectively etching the micro-lens material, where the upper dielectric layer 132 has a substantially flat upper surface in regions (e.g., the gaps 141) laterally offset the first and second micro-lenses 134a-d, 136a-d and is formed concurrently with the first and second micro-lenses 134a-d, 136a-d. In an alternative embodiment, a process for forming the upper dielectric layer 132 includes: depositing (e.g., by a spin-on method, CVD, PVD, ALD, etc.) the upper dielectric layer 132 on the grid structure 122 and performing a planarization process (e.g., a CMP process, an etching process, etc.) on the upper dielectric layer 132 such that the upper dielectric layer 132 has a substantially flat upper surface. In such embodiments, the upper dielectric layer 132 is formed before forming the first and second micro-lenses 134a-d, 136a-d (e.g., before forming depositing the micro-lens material).

FIG. 22 illustrates a method 2200 of some embodiments of forming an imaging device comprises a plurality of micro-lenses having different lateral offsets or shifts with corresponding pixel units. Although the method 2200 is illustrated and/or described as a series of acts or events, it will be appreciated that the method is not limited to the illustrated ordering or acts. Thus, in some embodiments, the acts may be carried out in different orders than illustrated, and/or may be carried our concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2202, a plurality of image sensor elements is formed within a semiconductor substrate, where each image sensor element comprises a plurality of pixel units having one or more photodetectors. FIG. 14 illustrates cross-sectional view 1400 corresponding to some embodiments of act 2202.

At act 2204, a plurality of pixel devices is formed on a front-side surface of the semiconductor substrate. FIG. 15 illustrates cross-sectional view 1500 corresponding to some embodiments of act 2204.

At act 2206, an interconnect structure is formed on the front-side surface of the semiconductor substrate. FIG. 16 illustrates cross-sectional view 1600 corresponding to some embodiments of act 2206.

At act 2208, an isolation structure is formed within the semiconductor substrate, where the isolation structure is disposed between adjacent photodetectors. FIG. 17 illustrates cross-sectional view 1700 corresponding to some embodiments of act 2208.

At act 2210, a grid structure is formed over a back-side surface of the semiconductor substrate. The grid structure comprises sidewalls defining a plurality of grid openings that are laterally offset or shifted from a corresponding pixel unit by a grid opening shift amounts. FIGS. 19A and 19B illustrate various views 1900a and 1900b corresponding to some embodiments of act 2210.

At act 2212, a plurality of light filters is formed over the semiconductor substrate, where the light filters fill the plurality of grid openings. FIGS. 20A and 20B illustrate various views 2000a and 2000b corresponding to some embodiments of act 2212.

At act 2214, a plurality of micro-lenses is formed over the light filters. The light filters are laterally offset or shifted from a corresponding pixel unit by lens shift amounts that may be different from one another or may be different between micro-lenses corresponding to different image sensor elements. FIGS. 21A and 21B illustrate various views 2100*a* and 2100*b* corresponding to some embodiments of act 2214.

Accordingly, in some embodiments, the present disclosure relates to an image sensor device comprises a plurality of micro-lenses disposed over a plurality of pixel units, where the micro-lenses are laterally offset or shifted from corresponding pixel units by different lens shift amounts.

In some embodiments, the present application provides an imaging device including: a first image sensor element and a second image sensor element respectively comprising a pixel unit disposed within a semiconductor substrate, wherein the first image sensor element is adjacent to the second image sensor element; a first micro-lens overlying the first image sensor element and laterally shifted from a center of the pixel unit of the first image sensor element by a first lens shift amount; and a second micro-lens overlying the second image sensor element and laterally shifted from a center of the pixel unit of the second image sensor element by a second lens shift amount different from the first lens shift amount. In an embodiment, the first micro-lens has a first area and the second micro-lens has a second area different from the first area. In an embodiment, the first micro-lens comprises a first curved sidewall adjacent to a first straight sidewall, wherein the first straight sidewall of the first micro-lens contacts the second micro-lens. In an embodiment, the first micro-lens further comprises a second straight sidewall, wherein a length of the first straight sidewall is different from a length of the second straight sidewall. In an embodiment, the pixel unit of the first image sensor element comprises a first plurality of photodetectors and the center of the pixel unit of the first image sensor element is disposed at a cross road of the first plurality of photodetectors, wherein the first plurality of photodetectors comprises a first photodetector diagonally opposite a second photodetector, wherein the first micro-lens directly overlies an entirety of the second photodetector and is laterally offset from at least an outer region of the first photodetector. In an embodiment, the pixel unit of the second image sensor element comprises a second plurality of photodetectors, wherein the first micro-lens directly overlies at least a portion of the second plurality of photodetectors. In an embodiment, the first micro-lens has a first shape and the second micro-lens has a second shape different from the first shape. In an embodiment, the first micro-lens and the second micro-lens each comprise a first straight sidewall having a first height, wherein the first straight sidewall of the first micro-lens contacts the first straight sidewall of the second micro-lens, and wherein the second micro-lens comprises a second straight sidewall opposite the first straight sidewall of the second micro-lens, wherein a second height of the second straight sidewall is less than the first height. In an embodiment, the imaging device further comprises a third micro-lens laterally adjacent to the second micro-lens, wherein the third micro-lens comprises a straight sidewall opposite the second straight sidewall of the second micro-lens, wherein a height of the straight sidewall of the third micro-lens is different from the second height.

In some embodiments, the present application provides an imaging device including: an array of image sensor elements comprising pixel units disposed within a semiconductor substrate, wherein the array of image sensor elements comprises a first image sensor element adjacent to a second image sensor element; a grid structure overlying the array of image sensor elements, wherein the grid structure comprises a plurality of grid openings overlying corresponding pixel units; an array of light filters disposed within the plurality of grid openings; and an array of micro-lenses disposed over the array of light filters, wherein the array of micro-lenses comprises a first plurality of micro-lenses overlying the first image sensor element and a second plurality of micro-lenses overlying the second image sensor element, wherein the first plurality of micro-lenses is shifted from corresponding pixel units in the first image sensor element by first lens shift amounts and the second plurality of micro-lenses is shifted from corresponding pixel units in the second image sensor element by second lens shift amounts different from the first lens shift amounts. In an embodiment, magnitudes and directions of the first lens shift amounts are different from magnitudes and directions of the second lens shift amounts. In an embodiment, a first gap is defined by sidewalls of the first plurality of micro-lenses and a second gap is defined by sidewalls of the second plurality of micro-lenses, wherein a shape of the first gap is different from a shape of the second gap. In an embodiment, a third gap is disposed between the first plurality of micro-lenses and the second plurality of micro-lenses, wherein a shape of the third gap is different from the shapes of the first and second gaps. In an embodiment, the shape of the first gap is symmetrical and the shape of the third gap is asymmetrical. In an embodiment, the imaging device further includes an isolation structure disposed within the semiconductor substrate and disposed around each pixel unit, wherein an outer edge of the grid structure is laterally shifted from an outer edge of the isolation structure by a grid shift amount, wherein the grid shift amount is different from the first lens shift amounts and the second lens shift amounts.

In some embodiments, the present application provides a method of forming an imaging device, the method includes: forming a plurality of image sensor elements comprising pixel units within a semiconductor substrate; forming an isolation structure within the semiconductor substrate, wherein the isolation structure is disposed between adjacent pixel units; depositing a grid layer over a back-side surface of the semiconductor substrate; performing an etching process on the grid layer to from a grid structure on the semiconductor substrate, wherein the grid structure comprises a plurality of sidewalls defining a plurality of grid openings overlying corresponding pixel units, wherein the grid openings are shifted from corresponding pixel units by grid opening shift amounts; forming a plurality of light filters in the grid openings; and forming an array of micro-lenses over the grid structure, wherein micro-lenses in the array of micro-lenses have different shapes from one another. In an embodiment, the micro-lenses are shifted from corresponding pixel units by lens shift amounts that are different from the grid opening shift amounts. In an embodiment, the array of micro-lenses comprises a first micro-lens and a second micro-lens adjacent to one another, wherein a height of a sidewall of the first micro-lens is different from a height of a sidewall of the second micro-lens. In an embodiment, an area of the first micro-lens is different from an area of the second micro-lens. In an embodiment, the array of micro-lenses comprises a plurality of first micro-lenses and a plurality of second micro-lenses, wherein the plurality of first micro-lenses are shifted inwards towards one another and the plurality of second micro-lenses are shifted outwards away from one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an imaging device, the method comprising:
   forming a plurality of image sensor elements comprising pixel units within a semiconductor substrate;
   forming an isolation structure within the semiconductor substrate, wherein the isolation structure is disposed between adjacent pixel units;
   depositing a grid layer over a back-side surface of the semiconductor substrate;
   performing an etching process on the grid layer to form a grid structure on the semiconductor substrate, wherein the grid structure comprises a plurality of sidewalls defining a plurality of grid openings overlying corresponding pixel units, wherein the grid openings are shifted from corresponding pixel units by grid opening shift amounts;
   forming a plurality of light filters in the grid openings;
   depositing a dielectric layer on the grid structure and the plurality of light filters; and
   forming an array of micro-lenses over the grid structure, wherein micro-lenses in the array of micro-lenses have different shapes from one another, wherein the dielectric layer is arranged between the plurality of light filters and the array of micro-lenses, wherein the dielectric layer and the array of micro-lenses respectively comprise a first material.

2. The method of claim 1, wherein the micro-lenses are shifted from corresponding pixel units by lens shift amounts that are different from the grid opening shift amounts.

3. The method of claim 1, wherein the array of micro-lenses comprises a first micro-lens and a second micro-lens adjacent to one another, wherein a height of a sidewall of the first micro-lens is different from a height of a sidewall of the second micro-lens.

4. The method of claim 3, wherein an area of the first micro-lens is different from an area of the second micro-lens.

5. The method of claim 1, wherein the array of micro-lenses comprises a plurality of first micro-lenses and a plurality of second micro-lenses, wherein the plurality of first micro-lenses are shifted inwards towards one another and the plurality of second micro-lenses are shifted outwards away from one another.

6. The method of claim 5, wherein a first gap is arranged at a middle region of the plurality of first micro-lenses and is defined by sidewalls of the plurality of first micro-lenses, wherein a second gap is arranged at a middle region of the plurality of second micro-lenses and is defined by sidewalls of the plurality of second micro-lenses, wherein a width of the first gap is less than a width of the second gap.

7. The method of claim 1, wherein forming the array of micro-lenses comprises:

depositing a micro-lens material over the grid structure and the plurality of light filters; and
   selectively etching the micro-lens material.

8. The method of claim 7, further comprising:
   forming a micro-lens template over the micro-lens material, wherein the micro-lens material is selectively etched according to the micro-lens template.

9. The method of claim 1, further comprising:
   depositing a passivation layer on the back-side surface of the semiconductor substrate, wherein the passivation layer is arranged between the semiconductor substrate and the grid structure.

10. A method of forming an imaging device, the method comprising:
   forming a first image sensor element and a second image sensor element laterally adjacent to one another in a substrate, wherein the first and second image sensor elements respectively comprise one or more photodetectors;
   etching the substrate to form a trench extending into a first surface of the substrate;
   forming an isolation structure in the trench, wherein the isolation structure comprises a first pair of isolation segments on opposing sides of the one or more photodetectors of the first image sensor element and a second pair of isolation segments on opposing sides of the one or more photodetectors of the second image sensor element;
   depositing a micro-lens material over the first surface of the substrate; and
   selectively etching the micro-lens material to form a plurality of micro-lenses over the substrate, wherein the plurality of micro-lenses comprises a first micro-lens over the first image sensor element and a second micro-lens over the second image sensor element, wherein a center of the first micro-lens is laterally offset from a center of the first pair of isolation segments by a first lens shift distance, and wherein a center of the second micro-lens is laterally offset from a center of the second pair of isolation segments by a second lens shift distance different from the first lens shift distance.

11. The method of claim 10, wherein in a cross-sectional view the first micro-lens comprises a first sidewall laterally offset from a second sidewall, wherein the first sidewall is spaced laterally between the first pair of isolation segments and the second sidewall is spaced laterally between the second pair of isolation segments.

12. The method of claim 11, wherein a first height of the first sidewall is greater than a second height of the second sidewall.

13. The method of claim 11, wherein a first sidewall of the second micro-lens contacts the first sidewall of the first micro-lens.

14. The method of claim 11, wherein before depositing the micro-lens material the method further comprises:
   depositing a grid layer over the first surface of the substrate; and
   etching the grid layer to form a grid structure over the substrate, wherein the grid structure comprises a first pair of grid segments over the first image sensor element and a second pair of grid segments over the second image sensor element, wherein a center of the first pair of grid segments is laterally offset from the center of the first pair of isolation segments by a first grid shift distance that is less than the first lens shift distance.

15. The method of claim 14, wherein a center of the second pair of grid segments is laterally offset from the center of the second pair of isolation segments by a second grid shift distance that is substantially equal to the first grid shift distance and less than the second lens shift distance.

16. A method of forming an imaging device, the method comprising:

receiving a semiconductor structure comprising:

a first image sensor element and a second image sensor element, wherein the first and second image sensor elements respectively comprise a plurality of pixel units in a substrate;

a grid structure over the substrate, wherein the grid structure comprises a plurality of grid openings overlying the plurality of pixel units of the first and second image sensor elements;

a plurality of light filters in the plurality of grid openings; and an isolation structure in the substrate and around the first and second image sensor elements, wherein the isolation structure laterally encloses the pixel units of the first and second image sensor elements, wherein an outermost sidewall of the grid structure is laterally offset from an outermost sidewall of the isolation structure by a first distance; and forming an array of micro-lenses over the plurality of light filters, wherein the array of micro-lenses comprises a plurality of first micro-lenses and a plurality of second micro-lenses, wherein the plurality of first micro-lenses are shifted inwards towards one another and the plurality of second micro-lenses are shifted outwards away from one another, wherein the plurality of first micro-lenses have convex upper surfaces and the plurality of second micro-lenses have convex upper surfaces, and wherein a sidewall of a first lens in the plurality of first micro-lenses adjacent to the outermost sidewall of the grid structure is laterally offset from the outermost sidewall of the grid structure by a second distance greater than the first distance.

17. The method of claim 16, wherein a second lens in the plurality of first micro-lenses contacts a third lens in the plurality of second micro-lenses.

18. The method of claim 17, wherein a width of the second lens is less than a width of the third lens.

19. The method of claim 16, wherein the first lens in the plurality of first micro-lenses overlies a first light filter in the plurality of light filters, wherein a second lens in the plurality of second micro-lenses overlies a second light filter in the plurality of light filters, wherein a center of the first lens is laterally offset from a center of the first light filter by a third distance different from a fourth distance between a center of the second lens and a center of the second light filter.

20. The method of claim 16, wherein a width of a segment of the grid structure between adjacent light filters in the plurality of light filters is less than the first distance.

* * * * *